US008441795B2

(12) United States Patent

Jones et al.

(10) Patent No.: US 8,441,795 B2

(45) Date of Patent: May 14, 2013

(54) HIGH POWER BAND PASS RF FILTER HAVING A GAS TUBE FOR SURGE SUPPRESSION

(75) Inventors: Jonathan L. Jones, Carson City, NV (US); Louis Ki Won Chang, Carson City, NV (US)

(73) Assignee: Transtector Systems, Inc., Hayden, ID (US)

( * ) Notice: Subject to any disclaimer, the term of this patent is extended or adjusted under 35 U.S.C. 154(b) by 56 days.

(21) Appl. No.: 13/303,784

(22) Filed: Nov. 23, 2011

(65) Prior Publication Data

US 2012/0068789 A1 Mar. 22, 2012

Related U.S. Application Data

(63) Continuation-in-part of application No. 13/101,089, filed on May 4, 2011.

(60) Provisional application No. 61/331,292, filed on May 4, 2010, provisional application No. 61/417,149, filed on Nov. 24, 2010.

(51) Int. Cl.
*H05K 7/20* (2006.01)
*H03H 7/01* (2006.01)

(52) U.S. Cl.
USPC ............................ 361/699; 333/185; 361/698

(58) Field of Classification Search ....................... None
See application file for complete search history.

(56) References Cited

U.S. PATENT DOCUMENTS

| | | | |
|---|---|---|---|
| 2,030,179 | A | 2/1936 | Potter |
| 3,167,729 | A | 1/1965 | Hall |
| 3,323,083 | A | 5/1967 | Ziegler |
| 3,619,721 | A | 11/1971 | Westendorp |
| 3,663,901 | A | 5/1972 | Forney, Jr. |
| 3,731,234 | A | 5/1973 | Collins |
| 3,750,053 | A | 7/1973 | LeDonne |
| 3,783,178 | A | 1/1974 | Philibert |
| 3,831,110 | A | 8/1974 | Eastman |
| 3,845,358 | A | 10/1974 | Anderson et al. |
| 3,944,937 | A | 3/1976 | Fujisawa et al. |
| 3,980,976 | A | 9/1976 | Tadama et al. |
| 4,046,451 | A | 9/1977 | Juds et al. |

(Continued)

FOREIGN PATENT DOCUMENTS

| | | |
|---|---|---|
| CH | 675933 | 11/1990 |
| JP | 11-037400 | 2/1999 |

(Continued)

*Primary Examiner* — Gregory Thompson

(74) *Attorney, Agent, or Firm* — Snell & Wilmer LLP

(57) ABSTRACT

A high power band pass RF filtering device having a housing defining an interior chamber and having one or more walls for substantially dividing the interior chamber into one or more sections. A circuit with filtering components for achieving strong attenuation of out-of-band signals is disposed within the interior chamber, certain components of the circuit being separated from one another by the walls. Ports on the housing electrically connect to a respective input node and output node of the circuit and also connect to surge protection elements for dissipating surge conditions present at the ports. A non-surge signal can travel between the ports and through the filtering components. An oil or other fluid is disposed and completely contained within the housing and contacts the circuit components for cooling the circuit components.

20 Claims, 19 Drawing Sheets

U.S. PATENT DOCUMENTS

| | | | | |
|---|---|---|---|---|
| 4,047,120 | A | 9/1977 | Lord et al. | |
| 4,112,395 | A | 9/1978 | Seward | |
| 4,262,317 | A | 4/1981 | Baumbach | |
| 4,359,764 | A | 11/1982 | Block | |
| 4,384,331 | A | 5/1983 | Fukuhara et al. | |
| 4,409,637 | A | 10/1983 | Block | |
| 4,481,641 | A | 11/1984 | Gable et al. | |
| 4,554,608 | A | 11/1985 | Block | |
| 4,563,720 | A | 1/1986 | Clark | |
| 4,586,104 | A | 4/1986 | Standler | |
| 4,689,713 | A | 8/1987 | Hourtane et al. | |
| 4,698,721 | A | 10/1987 | Warren | |
| 4,727,350 | A | 2/1988 | Ohkubo | |
| 4,952,173 | A | 8/1990 | Peronnet et al. | |
| 4,984,146 | A | 1/1991 | Black et al. | |
| 4,985,800 | A | 1/1991 | Feldman et al. | |
| 5,053,910 | A | 10/1991 | Goldstein | |
| 5,057,964 | A | 10/1991 | Bender et al. | |
| 5,102,818 | A | 4/1992 | Paschke et al. | |
| 5,122,921 | A | 6/1992 | Koss | |
| 5,124,873 | A | 6/1992 | Wheeler | |
| 5,142,429 | A | 8/1992 | Jaki | |
| 5,166,855 | A | 11/1992 | Turner | |
| 5,278,720 | A | 1/1994 | Bird | |
| 5,321,573 | A | 6/1994 | Persona et al. | |
| 5,353,189 | A | 10/1994 | Tomlinson | |
| 5,442,330 | A | 8/1995 | Fuller et al. | |
| 5,537,044 | A | 7/1996 | Stahl | |
| 5,617,284 | A | 4/1997 | Paradise | |
| 5,625,521 | A | 4/1997 | Luu | |
| 5,667,298 | A | 9/1997 | Musil et al. | |
| 5,721,662 | A | 2/1998 | Glaser et al. | |
| 5,781,844 | A | 7/1998 | Spriester et al. | |
| 5,790,361 | A | 8/1998 | Minch | |
| 5,844,766 | A | 12/1998 | Miglioli et al. | |
| 5,854,730 | A | 12/1998 | Mitchell et al. | |
| 5,953,195 | A | 9/1999 | Pagliuca | |
| 5,966,283 | A | 10/1999 | Glaser et al. | |
| 5,982,602 | A | 11/1999 | Tellas et al. | |
| 5,986,869 | A | 11/1999 | Akdag | |
| 6,054,905 | A | 4/2000 | Gresko | |
| 6,060,182 | A | 5/2000 | Tanaka et al. | |
| 6,061,223 | A | 5/2000 | Jones et al. | |
| 6,086,544 | A | 7/2000 | Hibner et al. | |
| 6,115,227 | A | 9/2000 | Jones et al. | |
| 6,137,352 | A | 10/2000 | Germann | |
| 6,141,194 | A | 10/2000 | Maier | |
| 6,177,849 | B1 | 1/2001 | Barsellotti et al. | |
| 6,236,551 | B1 | 5/2001 | Jones et al. | |
| 6,243,247 | B1 | 6/2001 | Akdag et al. | |
| 6,252,755 | B1 | 6/2001 | Willer | |
| 6,281,690 | B1 | 8/2001 | Frey | |
| 6,292,344 | B1 | 9/2001 | Glaser et al. | |
| 6,342,998 | B1 | 1/2002 | Bencivenga et al. | |
| 6,381,283 | B1 | 4/2002 | Bhardwaj et al. | |
| 6,385,030 | B1 | 5/2002 | Beene | |
| 6,394,122 | B1 | 5/2002 | Sibley et al. | |
| 6,421,220 | B2 | 7/2002 | Kobsa | |
| 6,502,599 | B1 | 1/2003 | Sibley et al. | |
| 6,527,004 | B1 | 3/2003 | Sibley et al. | |
| 6,721,155 | B2 | 4/2004 | Ryman | |
| 6,754,060 | B2 | 6/2004 | Kauffman | |
| 6,757,152 | B2 | 6/2004 | Galvagni et al. | |
| 6,785,110 | B2 | 8/2004 | Bartel et al. | |
| 6,789,560 | B1 | 9/2004 | Sibley et al. | |
| 6,814,100 | B1 | 11/2004 | Sibley et al. | |
| 6,968,852 | B1 | 11/2005 | Sibley | |
| 6,975,496 | B2 | 12/2005 | Jones et al. | |
| 7,082,022 | B2 | 7/2006 | Bishop | |
| 7,104,282 | B2 | 9/2006 | Hooker et al. | |
| 7,106,572 | B1 | 9/2006 | Girard | |
| 7,130,103 | B2 | 10/2006 | Murata | |
| 7,159,236 | B2 | 1/2007 | Abe et al. | |
| 7,221,550 | B2 | 5/2007 | Chang et al. | |
| 7,250,829 | B2 | 7/2007 | Namura | |
| 7,259,640 | B2 * | 8/2007 | Brown et al. | 333/160 |
| 7,430,103 | B2 | 9/2008 | Kato | |
| 7,623,332 | B2 | 11/2009 | Frank et al. | |
| 7,729,118 | B2 * | 6/2010 | Lai et al. | 361/699 |
| 7,753,662 | B2 * | 7/2010 | Lai et al. | 417/423.9 |
| 7,808,752 | B2 | 10/2010 | Richiuso et al. | |
| 8,228,656 | B2 * | 7/2012 | Kauffman | 361/118 |
| 2002/0167302 | A1 | 11/2002 | Gallavan | |
| 2002/0191360 | A1 | 12/2002 | Colombo et al. | |
| 2003/0072121 | A1 | 4/2003 | Bartel et al. | |
| 2003/0211782 | A1 | 11/2003 | Esparaz et al. | |
| 2004/0121648 | A1 | 6/2004 | Voros | |
| 2004/0145849 | A1 | 7/2004 | Chang et al. | |
| 2004/0264087 | A1 | 12/2004 | Bishop | |
| 2005/0036262 | A1 | 2/2005 | Siebenthall et al. | |
| 2005/0044858 | A1 | 3/2005 | Hooker et al. | |
| 2005/0104685 | A1 * | 5/2005 | Kuroki et al. | 333/133 |
| 2005/0176275 | A1 | 8/2005 | Hoopes et al. | |
| 2005/0185354 | A1 | 8/2005 | Hoopes | |
| 2006/0146458 | A1 | 7/2006 | Mueller | |
| 2007/0053130 | A1 | 3/2007 | Harwath | |
| 2007/0139850 | A1 | 6/2007 | Kamel et al. | |
| 2009/0103226 | A1 | 4/2009 | Penwell et al. | |
| 2009/0109584 | A1 | 4/2009 | Jones et al. | |
| 2009/0284888 | A1 | 11/2009 | Bartel et al. | |
| 2011/0080683 | A1 | 4/2011 | Jones et al. | |
| 2011/0141646 | A1 | 6/2011 | Jones et al. | |
| 2011/0159727 | A1 | 6/2011 | Howard et al. | |
| 2011/0273402 | A1 * | 11/2011 | Hotelling et al. | 345/174 |
| 2011/0273845 | A1 * | 11/2011 | Jones et al. | 361/699 |
| 2012/0068789 | A1 * | 3/2012 | Jones et al. | 333/185 |

FOREIGN PATENT DOCUMENTS

| | | |
|---|---|---|
| KR | 1020090018497 | 2/2009 |
| WO | WO 95/10116 | 4/1995 |
| WO | PCT/US03/017050 | 5/2003 |
| WO | WO 2011-119723 | 12/2011 |

* cited by examiner

HIGH POWER BAND PASS RF FILTER HAVING A GAS TUBE FOR SURGE SUPPRESSION

CROSS REFERENCE TO RELATED APPLICATIONS

This application is a continuation-in-part application of U.S. patent application Ser. No. 13/101,089, filed on May 4, 2011, which claims the benefit and priority of U.S. Provisional Application No. 61/331,292, filed on May 4, 2010, the entire contents of which is incorporated by reference herein.

This application claims the benefit and priority of U.S. Provisional Application No. 61/417,149, filed on Nov. 24, 2010, the entire contents of which is hereby incorporated by reference.

BACKGROUND

1. Field

The present invention relates generally to band pass RF filters and improvements thereof. More particularly, the invention relates to high power band pass RF filters with surge protection elements and improvements thereof.

2. Description of the Related Art

Band pass RF filters for use in electronic circuits or between systems or devices are known and used in the art. In-line RF filter devices are similarly known and used in the art. Often in electrical systems, it is desirable to control signal frequencies to a desired range of frequency values. Band pass filters can be used for such purposes by rejecting or attenuating frequencies outside the desired range. In-line band pass filter devices connected along a conductive path between a source and a connecting system will only pass the desired range of frequencies to the connecting system. Signal frequencies outside of the desired range would ideally be highly attenuated. A band pass filter should have as flat of a pass-band as possible so passed signals experience little to no attenuation. A band pass filter should also transition from the pass-band to outside the pass-band with a sharp roll-off, narrow in frequency, to limit the passing of partially attenuated signal frequencies existing outside the pass-band.

As systems and electronics increase in complexity and size, power requirements can increase as well. Even in simple systems or devices, large amounts of power may be required or transmitted along signal wires or transmission cables. Operating frequency requirements are often still present in such systems, illustrating the need for frequency filtering devices capable of operating at these increased power levels. Surge events, particularly in such high power applications, necessitate additional considerations since the filtering electronics may be subjected to significant over-voltage or over-current conditions. Thus, an ideal electronic filtering device for such applications would strongly attenuate out-of-band signals while performing little attenuation to in-band signals, operate in high power applications, manage surge conditions present at the device to prevent damage and have a low manufacturing cost.

SUMMARY

One embodiment of the present invention is an electronic filtering device including a printed circuit board for filtering a signal connected to the electronic filtering device. Signals operating outside of the device's designed frequency band are highly attenuated while signals operating within the frequency band experience little attenuation. The electronic filtering device includes a fluid-sealed housing defining a cavity therein for containing the printed circuit board. Two connector assemblies acting as connection terminals are secured to the housing. One connector assembly is connected as an input to the printed circuit board and the other connector assembly is connected as an output to the printed circuit board. Thus, a signal present on one connector assembly can travel through the printed circuit board to the other connector assembly for filtering of the signal. A fluid, such as oil, is disposed in the cavity with the printed circuit board and makes contact with the printed circuit for cooling purposes. Additionally, surge protection elements, such as gas tubes, are integrated with the connector assemblies for dissipating any surges seen at the connector assemblies before the surges can be transmitted through to the printed circuit board.

By positioning the printed circuit board in the cavity of the housing with the cooling fluid, the electronic filtering device can operate with higher power capabilities than traditional filters due to dissipation of the additional heat from the increased voltage or current levels by the cooling fluid. Use of the cooling fluid also helps keep manufacturing costs down since the electronic filtering device can dissipate heat without being substantially expanded in size to accommodate fans or other bulky heat-sink devices coupled to the printed circuit board. Moreover, as power levels increase, surge protection becomes more desirable and the easily serviceable surge protection element integrated into the device protects the filtering circuit from damage, making the electronic filtering device attractive for use in industry.

The electronic filtering device is also easily adaptable to alternative filtering circuits. With both the cooling provisions and the surge protection capabilities separate from the manufacturing or design of the printed circuit board, alternative circuit designs can easily be incorporated onto a printed circuit board for inclusion in the housing without requiring substantial redesign of other components making up the electronic filtering device. This not only allows for the possibility of designing customer-specific filtering circuits for incorporation into the housing at a lower cost, but also allows for alternative circuit product line expansion at lower engineering or manufacturing expense.

The present invention may also utilize one or more isolating walls in an interior cavity of a fluid-sealed housing for containing one or more discrete circuit components and/or provide for tunable capacitances. In one embodiment, the present invention may provide a fluid-sealed housing defining a cavity therein and a first wall coupled with the housing and positioned in the cavity, the first wall having a first side and a second side. A first circuit component is positioned in the cavity adjacent to the first side of the first wall and a second circuit component is positioned in the cavity adjacent to the second side of the first wall. A fluid is disposed in the cavity and contacts the first circuit component or the second circuit component for cooling the first circuit component or the second circuit component. A connector assembly is coupled with the housing and has a conductive element electrically connected to the first circuit component or the second circuit component. A surge protection element is electrically connected between the conductive element and the housing.

In another embodiment, the present invention may provide a high power band pass RF filtering apparatus for the filtering of electronic signals including a sealed housing defining a cavity therein and configured to prevent a leaking of fluid to outside of the housing, the cavity at least partially defined by a conductive surface of the housing. A circuit component is located in the cavity and is coupled with the housing. A conductive element is located in the cavity of the housing. An insulating element is located between the conductive surface of the housing and the conductive element in the cavity for generating a capacitance. An oil is disposed in the cavity and contacting the circuit component for dissipating heat from the circuit component. A connector assembly, having a center pin electrically connected to the circuit component, is secured to the housing and configured to provide an electrical connection from outside the housing to the circuit component in the cavity of the housing. A surge protection element is integrated with the connector assembly and is electrically connected between the center pin of the connector assembly and the housing.

In yet another embodiment, the present invention may provide a high power band pass RF filtering apparatus with surge protection for the attenuation of frequencies outside of a pass-band and include a housing defining a cavity therein, the housing adapted to prevent a leaking of fluid from within the cavity to outside of the housing. A first wall is coupled with the housing and is positioned within the cavity, the first wall being disposed along a first axis. A second wall is coupled with the housing and positioned within the cavity, the second wall being disposed along the first axis. An insulating material is positioned within the cavity and adjacent to the first wall or the second wall. A first circuit component is positioned within the cavity and coupled to the insulating material while a second circuit component is positioned within the cavity and coupled to the housing. An oil is disposed within the cavity and substantially filling the cavity, the oil submerging the first circuit component or the second circuit component for dissipating heat. An input connector assembly is secured to the housing and has an input center pin, a portion of the input center pin positioned within the cavity of the housing while an output connector assembly is secured to the housing and has an output center pin, a portion of the output center pin positioned within the cavity of the housing. An input gas tube is integrated with the input connector assembly for surge protection, the input gas tube electrically connected between the input center pin and the housing while an output gas tube is integrated with the output connector assembly for surge protection, the output gas tube electrically connected between the output center pin and the housing.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
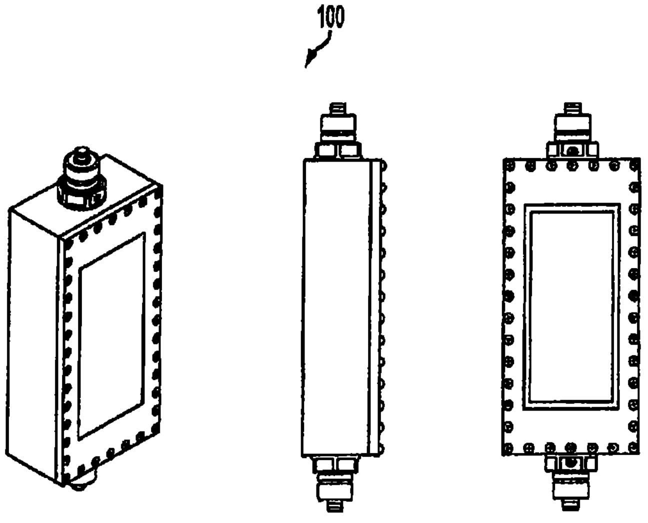
FIG. 1 shows different sealed views of an RF surge protector according to an embodiment of the invention.

Referring now to FIG. 1, a sealed RF surge protector 100 is shown from three perspectives: an angled perspective, a side perspective and a front perspective. The RF surge protector 100 has two connection terminals positioned on a housing of the RF surge protector 100. By connecting a first cable to the first connection terminal and a second cable to the second connection terminal, voltages and currents can flow from the first cable, through the RF surge protector 100 and to the second cable or vice versa. In the preferred embodiment, the housing is approximately 13 inches tall, 6 inches wide and 3.5 inches deep.

Surge conditions at the connection terminals are responded to by dissipating the surge to the housing of the RF surge protector 100, as described in greater detail herein. In this manner, only the desired current and voltage levels are passed between the two connection terminals and helps prevent damage to any filtering components of the RF surge protector 100. The RF surge protector 100 contains various electronic and mechanical parts as part of its manufacturing, these electronic and mechanical parts shown and discussed in greater detail herein.

Figure 2:
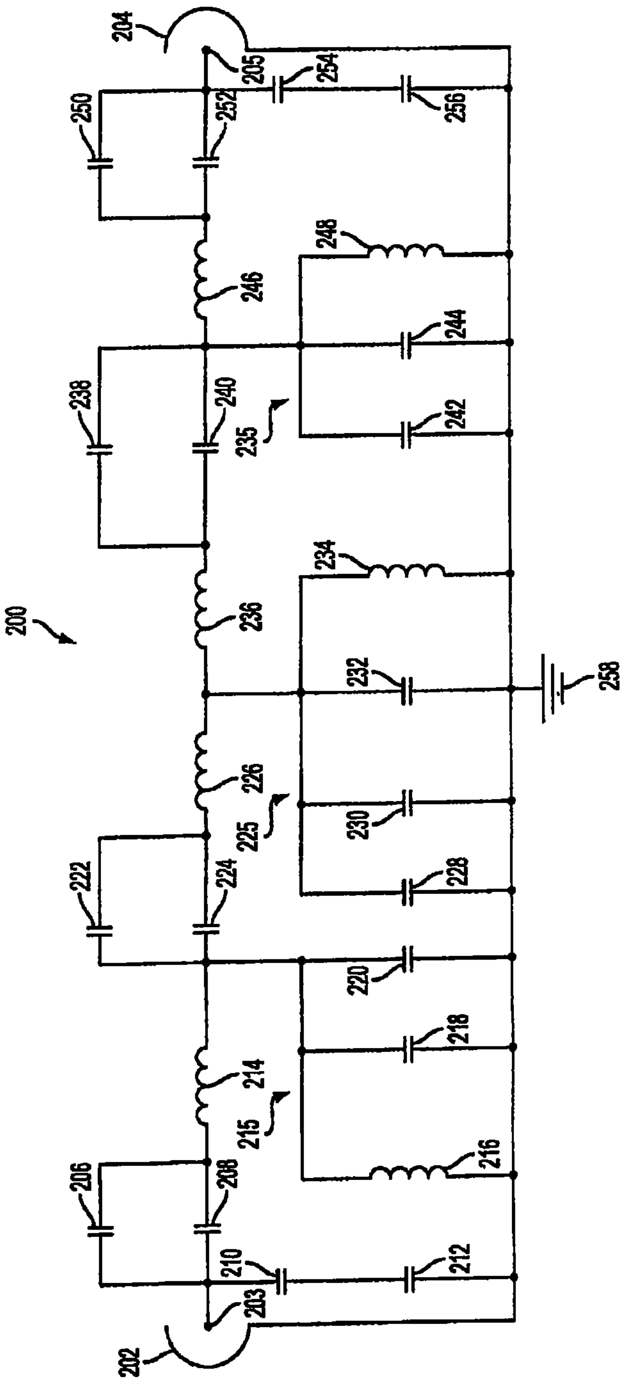
FIG. 2 is a schematic circuit diagram of a high power band pass RF filter according to an embodiment of the invention.

FIG. 2 shows a schematic circuit diagram 200 of a high power band pass RF filter. The band pass filter includes a number of different electrical components, such as capacitors and inductors, attached or mounted to a printed circuit board 313 (see FIG. 3). For illustrative purposes, the schematic circuit diagram 200 will be described with reference to specific capacitance and inductance values to achieve specific RF band pass frequencies of operation and power requirements. However, other specific capacitance and inductance values or configurations may be used to achieve other RF band pass characteristics. Moreover, other electronic filters (e.g., low pass filters, high pass filters or band stop filters) may also be achieved in place of the band pass filter. Characteristics of the band pass circuit described by schematic circuit diagram 200 include an operating frequency range of 160 to 174 MHz, a nominal impedance of 50Ω, an average input power of 200 W, a max peak insertion loss in bandwidth of 1.5 dB, an average insertion loss ripple in bandwidth of 0.7 dB, a max return loss in bandwidth of 17 dB, an operating temperature of −40° C. to 85° C. and a turn-on voltage of ±300V±20%.

An input port 202 and an output port 204 are shown on the left and right sides of the schematic circuit diagram 200. Various components are coupled between the input port 202 and the output port 204. As discussed in greater detail herein, a surge protection element (not shown in FIG. 2), such as gas tube 402 (see FIG. 4), may be incorporated as part of either the input port 202 or the output port 204. A signal applied at the input port 202 travels through the various components to the output port 204. The schematic circuit diagram 200 can also operate in a bi-directional mode, hence the input port 202 can function as an output port and the output port 204 can function as an input port.

The schematic circuit diagram 200 operates as a high power band pass filter with an operating frequency range between 160 MHz and 174 MHz. Signals outside of this frequency range or pass-band are attenuated. For example, the schematic circuit diagram 200 provides greater than 80 dB of attenuation at 15.4 MHz and greater than 50 dB of attenuation at 1 GHz, as described in greater detail for FIGS. 7 and 8 herein. In addition, the schematic circuit diagram 200 produces sharp roll-offs of signals at the pass-band transitions, which is desirable for band pass filters.

Frequency performance of the schematic circuit diagram 200 includes a desirable high return loss of greater than 20 dB within the operating frequency range of 160 to 174 MHz. Likewise, a desirable low insertion loss of less than 0.4 dB is obtained within the operating frequency range of 160 to 174 MHz. By contrast, for signals at frequencies outside the operating range, the insertion loss is greater than 80 dB at 15.4 MHz and is greater than 50 dB at 1.0 GHz as stated above. Thus, the out-of-band frequencies are highly attenuated.

Turning more specifically to the various components used in the schematic circuit diagram 200, the input port 202 has a center pin 203 connected at an input node of the circuit and the output port 204 has a center pin 205 connected at an output node of the circuit. The connection at the input port 202 and the output port 204 may be a center conductor such as a coaxial line where the center pins 203 and 205 propagate the dc currents and the RF signals and an outer shield surrounds the center pins. The center conductor enables voltages and currents to flow through the circuit. So long as the voltages are below surge protection levels, currents will flow between the input port 202 and the output port 204 and the voltages at each end will be similar. The center pins 203 and 205 also maintain the system RF impedance (e.g., 50Ω, 75Ω, etc.). This configuration is a DC block topology as seen by the series capacitors. By utilizing a different band pass circuit with series inductors and shunt capacitors, a dc pass filter may be achieved. The dc voltage on the center pins 203 and 205 would be used as the operating voltage to power the electronic components that are coupled to the output port 204.

The schematic circuit diagram 200 includes four sets of capacitors (206 and 208, 222 and 224, 238 and 240, 250 and 252). Each of the four sets is placed in a parallel circuit configuration. The four sets of capacitors are used to increase the power handling capabilities of the circuit. For example, the circuit shown by schematic circuit diagram 200 can handle up to 250 watts of power. The capacitors 206, 208, 250 and 252 have values of approximately 120 picoFarads (pF) each. The capacitors 222, 224, 238 and 240 have values of approximately 3.3 picoFarads (pF) each. Additional capacitors are utilized in the schematic circuit diagram 200 for attenuating the out-of-band frequencies or signals. Two sets of series capacitors (210 and 212, 254 and 256) are used for this purpose and have values of approximately 2.2 picoFarads (pF) each.

The schematic circuit diagram 200 also includes four inductors 214, 226, 236 and 246 positioned in series between the input port 202 and the output port 204. The four inductors 214, 226, 236 and 246 are used for in-band tuning of the circuit. The inductors 214 and 246 each have a calculated low inductance value, substantially a short, in-air. The inductors 226 and 236 have calculated values of approximately 200 nanoHenries (nH) each in-air. The above inductor values may substantially change when immersed in oil 315 (see FIG. 3) as opposed to in-air.

Preferably, three tuning sections 215, 225 and 235 are used to tune the band pass stage of the circuit. Additional or fewer tuning sections may be used in an alternative embodiment. The first tuning section 215 includes an inductor 216 and capacitors 218 and 220. The second tuning section 225 includes an inductor 234 and capacitors 228, 230 and 232. The third tuning section 235 includes an inductor 248 and capacitors 242 and 244. The inductors 216, 234 and 248 have calculated values of approximately 100 nanoHenries (nH) each in-air. Similar to the above, the inductor values may be different when immersed in oil 315 (see FIG. 3). The capacitors 218, 220, 230, 242 and 244 have values of approximately 10 picoFarads (pF) each. The capacitors 228 and 232 have values of approximately 27 picoFarads (pF) each. As shown, the three tuning sections 215, 225 and 235 are grounded to a common ground 258, which can be connected to the housing of the RF surge protector 300 (see FIG. 3). In an alternative embodiment, different components or component values may be used to obtain alternative filter characteristics.

Figure 3:
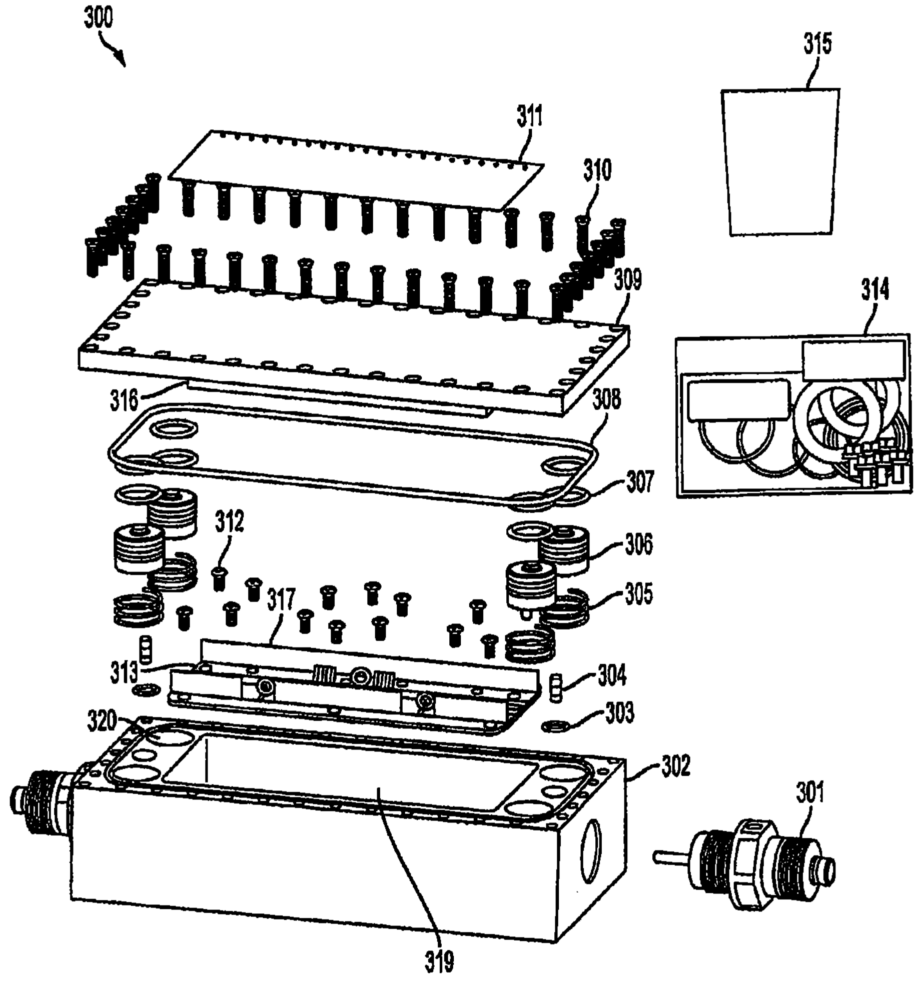
FIG. 3 is a disassembled view of an RF surge protector housing the circuit described in FIG. 2 according to an embodiment of the invention.

Referring now to FIG. 3, a disassembled view of an RF surge protector 300 is shown housing the circuit described in FIG. 2 according to an embodiment of the invention. The RF surge protector 300 has a housing 302 defining a cavity 319. The components shown by schematic circuit diagram 200 (see FIG. 2) are mounted or included on a printed circuit board 313 and the printed circuit board 313 is positioned within the cavity 319. The printed circuit board 313 is fastened to the housing 302 by a plurality of screws 312. In an alternative embodiment, other fasteners may be used to couple the printed circuit board 313 to the housing 302 or no fasteners may be needed.

The printed circuit board 313 electrically connects to a connector assembly 301 secured to a portion of the housing 302. The connector assembly 301 functions as the input port 202 shown on the schematic circuit diagram 200 (see FIG. 2) and as a first connection terminal of the RF surge protector 300. Similarly, another connector assembly 301 secured to a portion of the housing 302 is electrically connected to the printed circuit board 313 and functions as the output port 204 shown on the schematic circuit diagram 200 (see FIG. 2) and as a second connection terminal of the RF surge protector 300. Additional details on the connector assembly 301 are discussed herein for FIG. 4.

One or more walls or sidebars 317 are attached to the printed circuit board 313 and extend in a direction that is perpendicular to a plane defined by the printed circuit board 313. The sidebars 317 are positioned on one or more sides of the printed circuit board 313 and are used to help isolate the RF signals, enhance the grounding of the printed circuit board 313 or provide a larger surface area for dissipation of heat. In one embodiment, the sidebars 317 are about 0.5 inches high and are made of a copper material. In an alternative embodiment, different dimensions, positioning or materials may be used or the sidebars 317 may be omitted completely.

The cavity 319 defined by the housing 302 is filled with an oil 315 for dissipating heat caused by heating of the components (e.g., capacitors and inductors) on the printed circuit board 313. Preferably, the oil 315 is STO-50, a silicon transformer oil. In an alternative embodiment, the oil 315 may be any silicone, mineral, synthetic or other oil, fluid or substance capable of adequately dissipating the heat generated on or by the printed circuit board 313. Preferably, the cavity 319 is filled with approximately 23 ounces of the oil 315 and the oil 315 is capable of reducing the temperature of the components from about 120° C. to about 80° C. The cavity 319 or the housing 302 are completely fluid-sealed in order to contain the oil 315 within the housing 302 without leaking. Preferably, the oil 315 substantially fills the entire cavity 319 in order to completely submerge the printed circuit board 313 in the oil 315. In an alternative embodiment, the cavity 319 may be filled with different volumes of the oil 315.

The RF surge protector 300 includes one or more cylindrical cavities 320 in the housing 302 for the placement of piston springs 305 and pistons 306 that are coupled with O-rings 307 to aid in sealing. In an alternative embodiment, other shapes for the cavities 320 may be used. The piston springs 305 and pistons 306 allow the oil 315 to expand and are used to exert a constant pressure within the cavity 319 when a cover 309 is attached to the housing 302. The cover 309 is sealed with the housing 302 using an O-ring 308 and a plurality of cover screws 310. The piston springs 305 and pistons 306 are sealed from the oil 315 using O-rings 307. Alternatively, the one or more cylindrical cavities 320 can be used as overflow cavities for any excess oil 315 from the cavity 319 due to heating and expanding of the oil 315. O-rings 303 and additional openings in the housing 302 for containing set screws 304 help secure the connector assembly 301 to the housing 302.

The RF surge protector 300 preferably includes a closed cell foam material 316 attached to a surface of the cover 309 to disrupt the oil's dielectric constant and keep high frequency out-of-band signals from reflecting within the cavity 319 causing signal interferences. The foam material 316 is sized to cover the entire opening formed by the cavity 319. The RF surge protector 300 also includes a label 311 attached to the cover 309 with identification, electrical, mechanical, safety or other information or parameters pertaining to the RF surge protector 300. In addition, a hardware kit 314 is shown with various parts used in the assembly of the RF surge protector 300 to allow for parts replacement.

Figure 4:
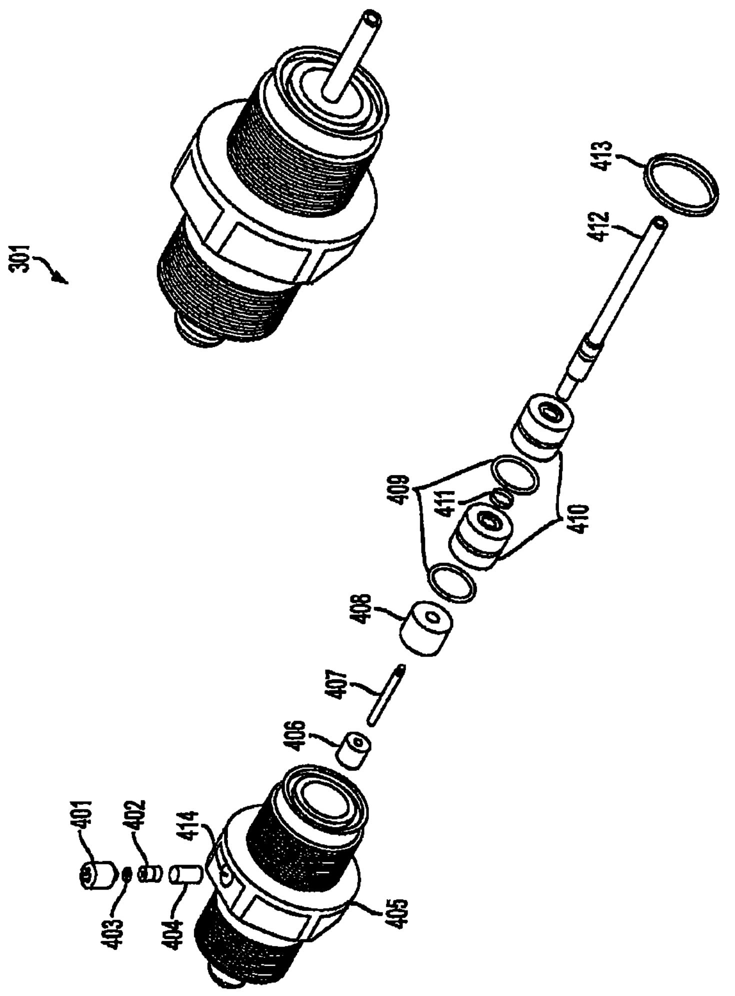
FIG. 4 is a disassembled view of a connector assembly according to an embodiment of the invention.

FIG. 4 shows a disassembled view of the connector assembly 301 discussed in FIG. 3 according to an embodiment of the invention. One connector assembly 301 is attached to each end of the housing 302 as described above (see FIG. 3). The connector assembly 301 has a conductive element or center pin 412 extending from one end of the connector assembly 301, the center pin 412 connecting to the printed circuit board 313 (see FIG. 3) either as the input center pin 203 or the output center pin 205 depending upon whether the connector assembly 301 is connected as the input port 202 or the output port 204 (see FIG. 2). Preferably, the center pin 412 is electrically connected to the printed circuit board 313 via a solder connection.

The connector assembly 301 includes a connector housing 405 defining a connector cavity 414. A gas tube 402 is positioned within a non-conductive tube 404 (e.g., a plastic or PTFE tube) and both are positioned within the connector cavity 414 of the connector housing 405. The gas tube 402 is secured in the connector cavity 414 with a gas tube retaining screw 401 and a washer 403. The non-conductive tube 404 isolates a portion of the gas tube 402 from the connector housing 405 to prevent shorting to ground or unintended contact between the portion of the gas tube 402 and the connector housing 405 (e.g., ground). The gas tube 402 is integrated into the connector housing 405 and does not come into contact with the oil 315 contained within the housing 302 (see FIG. 3). In one embodiment, the gas tube 402 is a three-terminal, dual-chambered device wherein each chamber has a breakdown voltage of approximately 150 volts, each chamber being used serially and thus additive to 300 volts. This serial arrangement puts the capacitances inherent in the gas tube 402 in series, resulting in lower total capacitance and thus better RF performance. In an alternative embodiment, a different gas tube 402 or configuration may be used or determined from transmit power requirements.

When the gas tube 402 is within the connector cavity 414, the gas tube electrically connects with the center pin 412 for dissipating surge conditions present on the center pin 412 through the gas tube 402 and to the connector housing 405. In an alternative embodiment, other surge protection elements may be used in place of or in addition to the gas tube 402 for dissipating a surge present upon the center pin 412. The center pin 412 is integrated with the connector assembly 301 by engaging with an internal pin 407 and coupled with a plurality of inserts (406, 408 and 410) and a plurality of O-rings (409, 411 and 413). Preferably, insert 406 is made of Teflon and inserts 408 and 410 are made of PTFE. In an alternative embodiment, other materials may be used.

Figure 5:
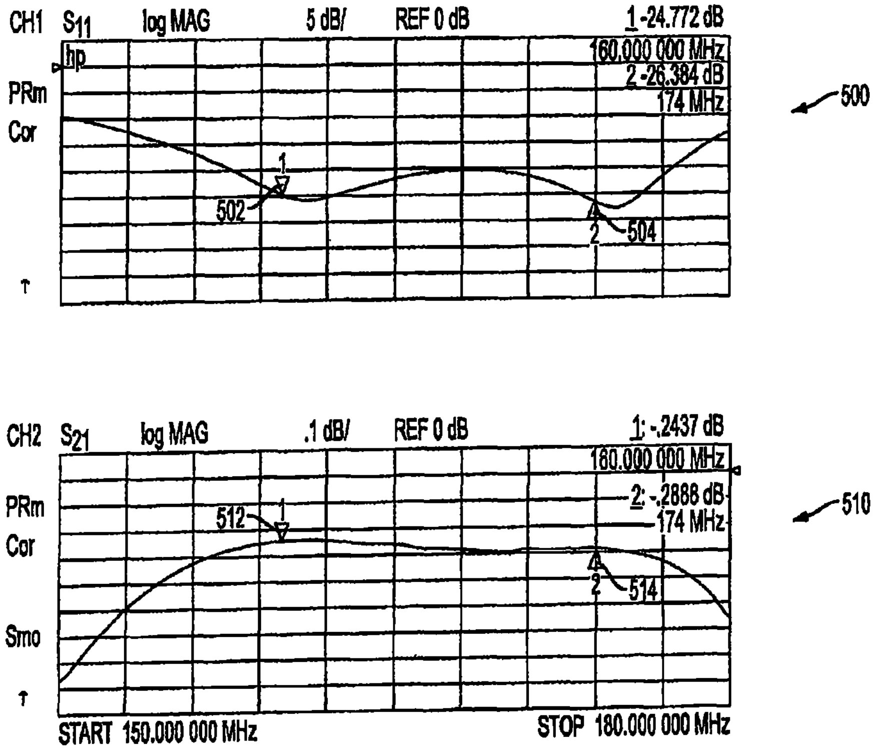
FIG. 5 is a top graph of the input in-band return loss and a bottom graph of the input in-band insertion loss of the RF surge protector of FIG. 3 according to an embodiment of the invention.
Figure 6:
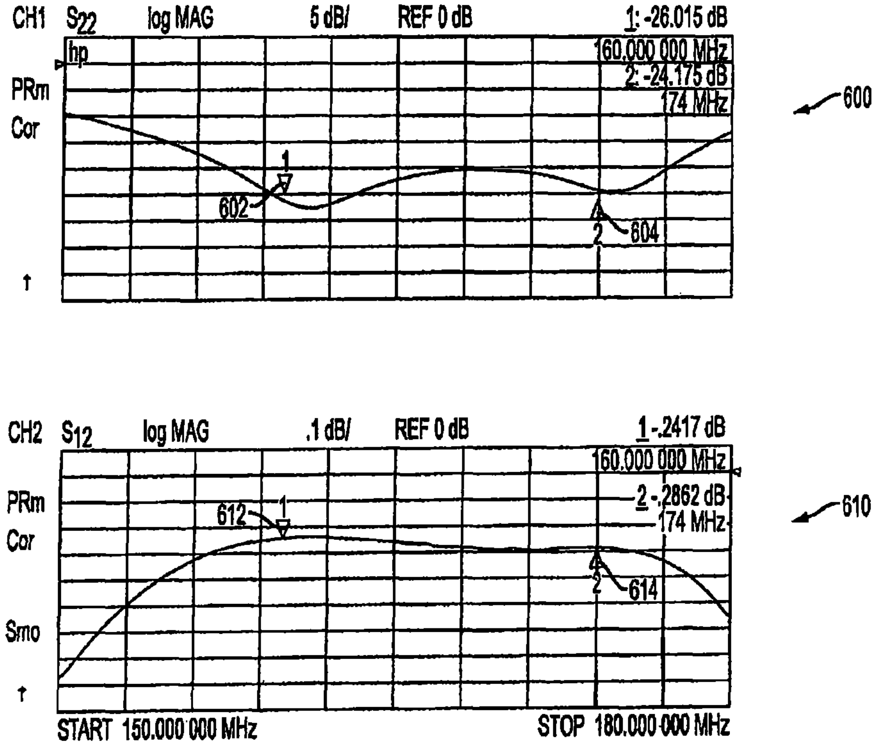
FIG. 6 is a top graph of the output in-band return loss and a bottom graph of the output in-band insertion loss of the RF surge protector of FIG. 3 according to an embodiment of the invention.

Referring now to FIG. 5 and FIG. 6, graphs are displayed showcasing in-band operating characteristics of the input and the output of the circuit shown by schematic circuit diagram 200. Graph 500 (see FIG. 5) shows the input in-band return loss and graph 600 (see FIG. 6) shows the output in-band return loss. For signals operating at frequencies within the pass-band of the filter shown by schematic circuit diagram 200, a high return loss (e.g., at least 20 dB) is desirable. The circuit shown by schematic circuit diagram 200 has been configured for an operating frequency range of 160 to 174 MHz as described above for FIG. 2. Input data-point 502 (see FIG. 5) indicates around 25 dB of return loss at 160 MHz. Input data-point 504 (see FIG. 5) indicates around 26 dB of return loss at 174 MHz. Similarly, output data-point 602 (see FIG. 6) indicates around 26 dB of return loss at 160 MHz and output data-point 604 (see FIG. 6) indicates around 24 dB of return loss at 174 MHz.

For signals operating at frequencies within the pass-band of the filter shown by schematic circuit diagram 200, a low insertion loss (e.g., less than 0.4 dB) is also desirable for limiting the attenuation of pass-band signals. Graph 510 (see FIG. 5) shows the input in-band insertion loss and graph 610 (see FIG. 6) shows the output in-band insertion loss. Input data-point 512 (see FIG. 5) indicates around 0.24 dB of insertion loss at 160 MHz. Input data-point 514 (see FIG. 5) indicates around 0.29 dB of insertion loss at 174 MHz. Similarly, output data-point 612 (see FIG. 6) indicates around 0.24 dB of insertion loss at 160 MHz and output data-point 614 (see FIG. 6) indicates around 0.29 dB of insertion loss at 174 MHz.

Figure 7:
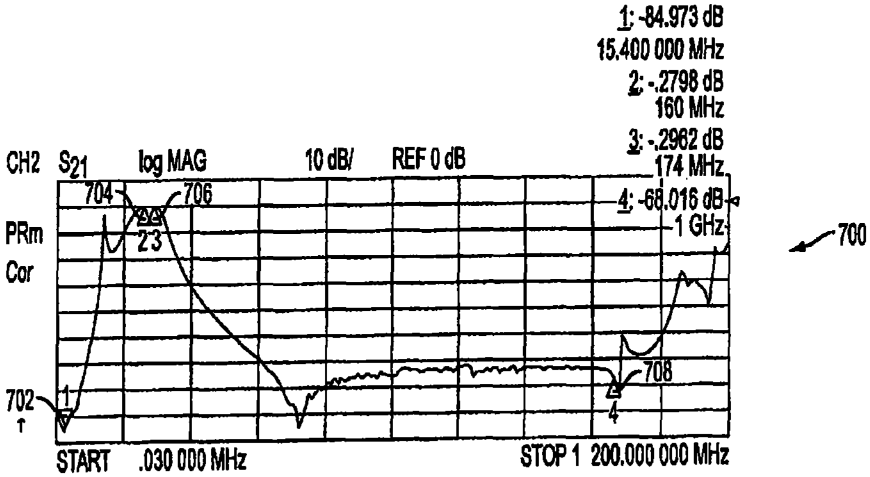
FIG. 7 is a graph of the input out-of-band insertion loss of the RF surge protector of FIG. 3 according to an embodiment of the invention.
Figure 8:
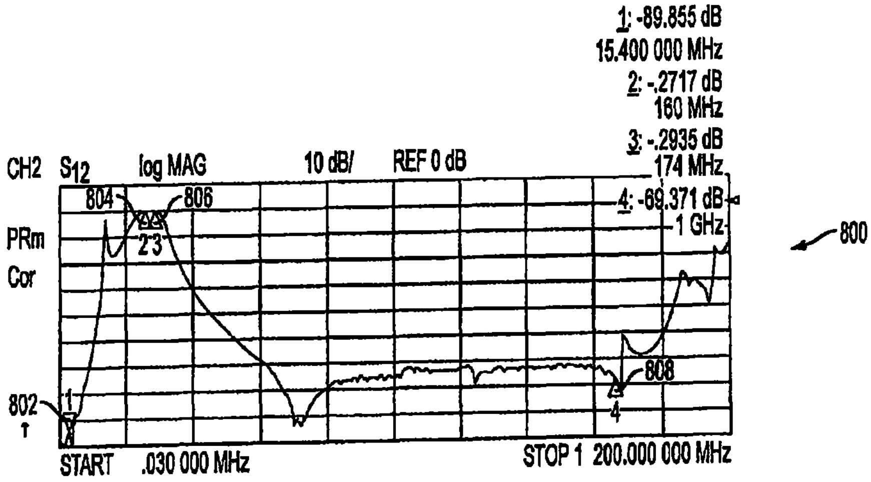
FIG. 8 is a graph of the output out-of-band insertion loss of the RF surge protector of FIG. 3 according to an embodiment of the invention.

FIG. 7 and FIG. 8 display graphs showcasing out-of-band operating characteristics of the input and the output of the circuit shown by schematic circuit diagram 200. Since the circuit shown by schematic circuit diagram 200 has been configured for an operating frequency range of 160 to 174 MHz, data-points at frequencies outside that pass-band are chosen for examples of out-of-band insertion loss. A high insertion loss (e.g., at least 50 dB) is desirable for out-of-band signals since out-of-band signals are to be highly attenuated.

Graph 700 (see FIG. 7) shows the input out-of-band insertion loss and graph 800 (see FIG. 8) shows the output out-of-band insertion loss. Input data-point 702 (see FIG. 7) indicates around 85 dB of insertion loss at 15.4 MHz. Input data-point 708 (see FIG. 7) indicates around 68 dB of insertion loss at 1 GHz. Similarly, output data-point 802 (see FIG. 8) indicates around 90 dB of insertion loss at 15.4 MHz and output data-point 808 (see FIG. 8) indicates around 69 dB of insertion loss at 1 GHz. As described above for FIG. 5 and FIG. 6, in-band insertion loss for input and output signals with frequencies of 160 to 174 MHz is low as shown by input data-points 704 and 706 (see FIG. 7) and output data-points 804 and 806 (see FIG. 8).

Figure 9:
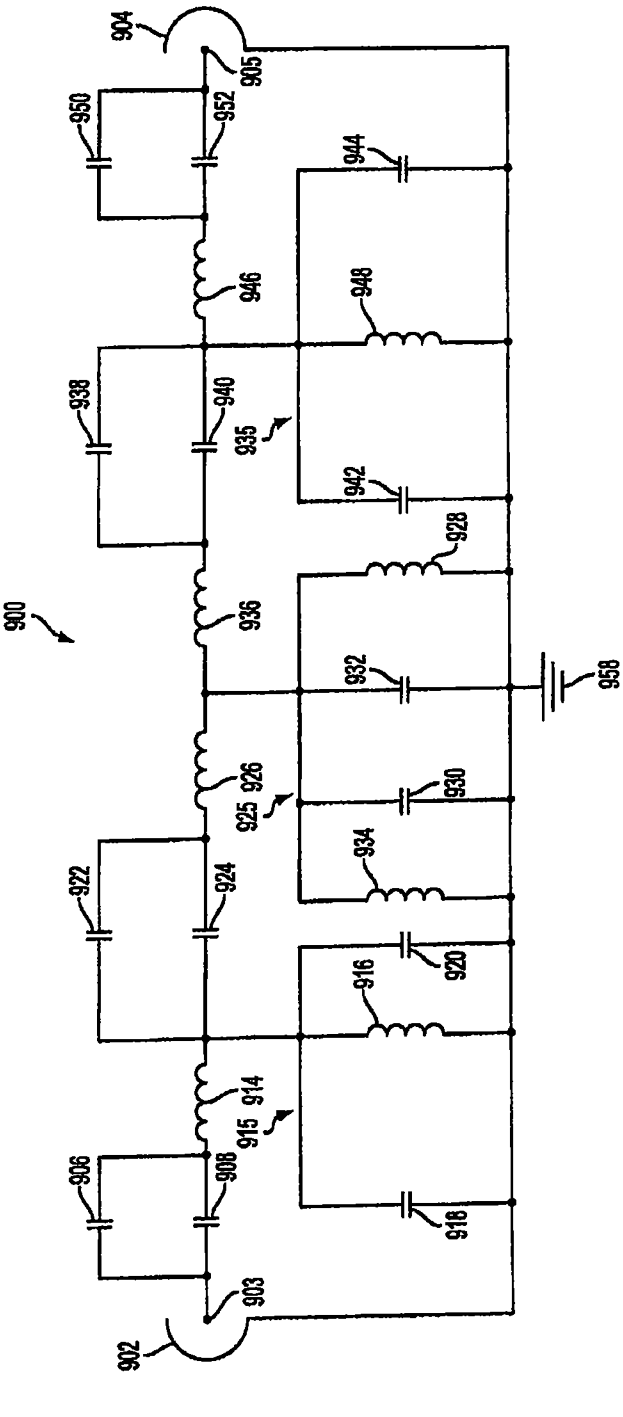
FIG. 9 is an alternative schematic circuit diagram of a high power band pass RF filter according to an embodiment of the invention.

Turning now to FIG. 9, an alternate schematic circuit diagram 900 of a high power band pass RF filter is shown. Similar to FIG. 2, the band pass filter of schematic circuit diagram 900 includes a number of different electrical components, such as capacitors and inductors that are mounted or included on a printed circuit board 1013 (see FIG. 10). For illustrative purposes, the schematic circuit diagram 900 will be described with reference to specific capacitance and inductance values to achieve specific RF band pass frequencies of operation and power requirements. However, other specific capacitance and inductance values and configurations may be used to achieve other RF band pass characteristics. The circuit described by schematic circuit diagram 900 has an operating frequency range of 225 to 400 MHz, a nominal impedance of 50Ω, an average input power of 250 W, a max peak insertion loss in bandwidth of 1.5 dB, an average insertion loss ripple in bandwidth of 0.7 dB, a max return loss in bandwidth of 14 dB, an operating temperature of −40° C. to 85° C. and a turn-on voltage of ±300V±20%.

An input port 902 and an output port 904 are shown on the left and right sides of the schematic circuit diagram 900. Various components are coupled between the input port 902 and the output port 904. As discussed in greater detail herein, a surge protection element (not shown in FIG. 9), such as gas tube 402 (see FIG. 4), may be incorporated as part of either the input port 902 or the output port 904. A signal applied at the input port 902 travels through the various components to the output port 904. The schematic circuit diagram 900 can also operate in a bi-directional mode, hence the input port 902 can function as an output port and the output port 904 can function as an input port.

The schematic circuit diagram 900 operates as a high power band pass filter with an operating frequency range between 225 MHz and 400 MHz. Signals outside of this frequency range or pass-band are highly attenuated. For example, the schematic circuit diagram 900 provides greater than 80 dB of attenuation at 10 MHz and greater than 40 dB of attenuation at 1 GHz, as described in greater detail for FIGS. 13 and 14 herein. In addition, the schematic circuit diagram 900 produces sharp roll-offs of signals at the pass-band transitions, which is desirable for band pass filters.

Frequency performance of the schematic circuit diagram 900 includes a desirable high return loss of greater than 17 dB within the operating frequency range of 225 to 400 MHz. Likewise, a preferably low insertion loss of less than or equal to 0.4 dB is obtained within the operating frequency range of 225 to 400 MHz. By contrast, for signals at frequencies outside the operating range, the insertion loss is greater than 80 dB at 10 MHz and is greater than 40 dB at 1 GHz as stated above. Thus, the out-of-band frequencies are highly attenuated.

Turning more specifically to the various components used in the schematic circuit diagram 900, the input port 902 has a center pin 903 connected at an input node of the circuit and the output port 904 has a center pin 905 connected at an output node of the circuit. The connection at the input port 902 and the output port 904 may be a center conductor such as a coaxial line where the center pins 903 and 905 propagate the dc currents and the RF signals and an outer shield surrounds the center pins. The center conductor enables voltages and currents to flow through the circuit. So long as the voltages are below surge protection levels, currents will flow between the input port 902 and the output port 904 and the voltages at each end will be similar. The center pins 903 and 905 also maintain the system RF impedance (e.g., 50Ω, 75Ω, etc.). This configuration is a DC block topology as seen by the series capacitors. By utilizing a different band pass circuit with series inductors and shunt capacitors, a dc pass filter may be achieved. The dc voltage on the center pins 903 and 905 would be used as the operating voltage to power the electronic components that are coupled to the output port 904.

The schematic circuit diagram 900 includes four sets of capacitors (906 and 908, 922 and 924, 938 and 940, 950 and 952). Each of the four sets is placed in a parallel circuit configuration. The four sets of capacitors are used to increase the power handling capabilities of the circuit. For example, the circuit shown by schematic circuit diagram 900 can handle up to 250 watts of power. The capacitors 906, 908, 950 and 952 have values of approximately 12 picoFarads (pF) each. The capacitors 922, 924, 938 and 940 have values of approximately 8.2 picoFarads (pF) each.

The schematic circuit diagram 900 also includes four inductors 914, 926, 936 and 946 positioned in series between the input port 902 and the output port 904. The four inductors 914, 926, 936 and 946 are used for in-band tuning of the circuit. The inductors 914, 926, 936 and 946 have calculated values of approximately 15 nanoHenries (nH) each in-air. The above inductor values may substantially change when immersed in oil 315 (see FIG. 10) as opposed to in-air.

Preferably, three tuning sections 915, 925 and 935 are used to tune the band-pass stage of the circuit. Additional or fewer tuning sections may be used in an alternative embodiment. The first tuning section 915 includes an inductor 916 and capacitors 918 and 920. The second tuning section 925 includes inductors 934 and 928 and capacitors 930 and 932. The third tuning section 935 includes an inductor 948 and capacitors 942 and 944. The inductors 916 and 948 have calculated values of approximately 75 nanoHenries (nH) each in-air. The inductor 934 has a calculated value of approximately 100 nanoHenries (nH) in-air. The inductor 928 has a calculated value of approximately 15 nanoHenries (nH)

in-air. Similar to the above, the inductor values may be different when immersed in oil 315 (see FIG. 10). The capacitors 918, 920, 942 and 944 have values of approximately 2.2 picoFarads (pF) each. The capacitors 930 and 932 have values of approximately 8.2 picoFarads (pF) each. As shown, the three tuning sections 915, 925 and 935 are grounded to a common ground 958, which can be connected to the housing of the RF surge protector 1000 (see FIG. 10). In an alternative embodiment, different components or component values may be used to obtain different band-pass characteristics.

Figure 10:
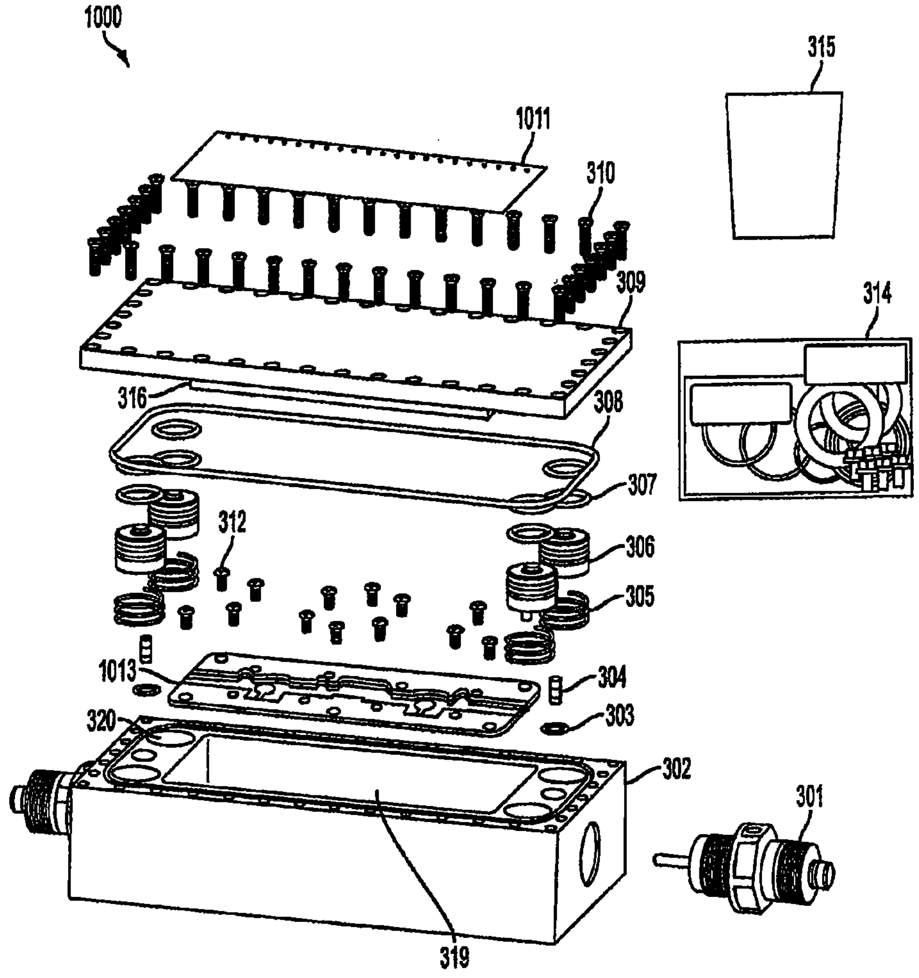
FIG. 10 is a disassembled view of an RF surge protector housing the circuit described in FIG. 9 according to an embodiment of the invention.

Referring now to FIG. 10, a disassembled view of an RF surge protector 1000 is shown housing the circuit described in FIG. 9 according to an embodiment of the invention. The RF surge protector 1000 is similar in construction to the RF surge protector 300 described in FIG. 3 and utilizes many of the same component parts. The RF surge protector 1000 includes the housing 302 defining the cavity 319. The components shown by schematic circuit diagram 900 (see FIG. 9) are mounted or included on a printed circuit board 1013 and the printed circuit board 1013 is positioned within the cavity 319. The printed circuit board 1013 is fastened to the housing 302 by the plurality of screws 312. In an alternative embodiment, other fasteners may be used to couple the printed circuit board 1013 to the housing 302 or no fasteners may be needed.

The printed circuit board 1013 electrically connects to the connector assembly 301 secured to a portion of the housing 302. The connector assembly 301 functions as the input port 902 shown on the schematic circuit diagram 900 (see FIG. 9) and as the first connection terminal of the RF surge protector 1000. Similarly, another connector assembly 301 secured to a portion of the housing 302 is electrically connected to the printed circuit board 1013 and functions as the output port 904 shown on the schematic circuit diagram 900 (see FIG. 9) and as the second connection terminal of the RF surge protector 1000. As previously described, the connector assembly 301 may include a surge protection element (e.g. the gas tube 402) for dissipating a surge condition seen at the connector assembly 301 (see FIG. 4).

The cavity 319 defined by the housing 302 is filled with the oil 315 for dissipating heat caused by heating of the components (e.g., capacitors and inductors) on the printed circuit board 1013. Preferably, the oil 315 is STO-50, a silicon transformer oil. In an alternative embodiment, the oil 315 may be any silicone, mineral, synthetic or other oil, fluid or substance capable of adequately dissipating the heat generated on the printed circuit board 1013. Preferably, the cavity 319 is filled with approximately 23 ounces of the oil 315 and the oil 315 is capable of reducing the temperature of the components from about 120° C. to about 80° C. The cavity 319 or the housing 302 are completely fluid-sealed in order to contain the oil 315 within the housing 302 without leaking. Preferably, the oil 315 substantially fills the entire cavity 319 in order to completely submerge the printed circuit board 1013 in the oil 315. In an alternative embodiment, the cavity 319 may be filled with different volumes of the oil 315.

The RF surge protector 1000 includes one or more cylindrical cavities 320 in the housing 302 for the placement of piston springs 305 and pistons 306 that are coupled with O-rings 307 to aid in sealing. In an alternative embodiment, other shapes for the cavities 320 may be used. The piston springs 305 and pistons 306 allow the oil 315 to expand and are used to exert a constant pressure within the cavity 319 when a cover 309 is attached to the housing 302. The cover 309 is sealed with the housing 302 using an O-ring 308 and a plurality of cover screws 310. The piston springs 305 and pistons 306 are sealed from the oil 315 using O-rings 307. Alternatively, the one or more cylindrical cavities 320 can be used as overflow cavities for any excess oil 315 from the cavity 319 due to heating and expanding of the oil 315. O-rings 303 and additional openings in the housing 302 for containing set screws 304 help secure the connector assembly 301 to the housing 302.

The RF surge protector 1000 preferably includes a closed cell foam material 316 attached to an inner surface of the housing 302 to disrupt the oil's dielectric constant and keep high frequency out-of-band signals from reflecting within the cavity 319 causing signal interferences. The foam material 316 is sized to cover the entire opening formed by the cavity 319. The RF surge protector 1000 also includes a label 1011 attached to the cover 309 with identification, electrical, mechanical, safety or other information or parameters pertaining to the RF surge protector 1000. In addition, a hardware kit 314 is shown with various parts used in the assembly of the RF surge protector 1000 to allow for parts replacement.

Figure 11:
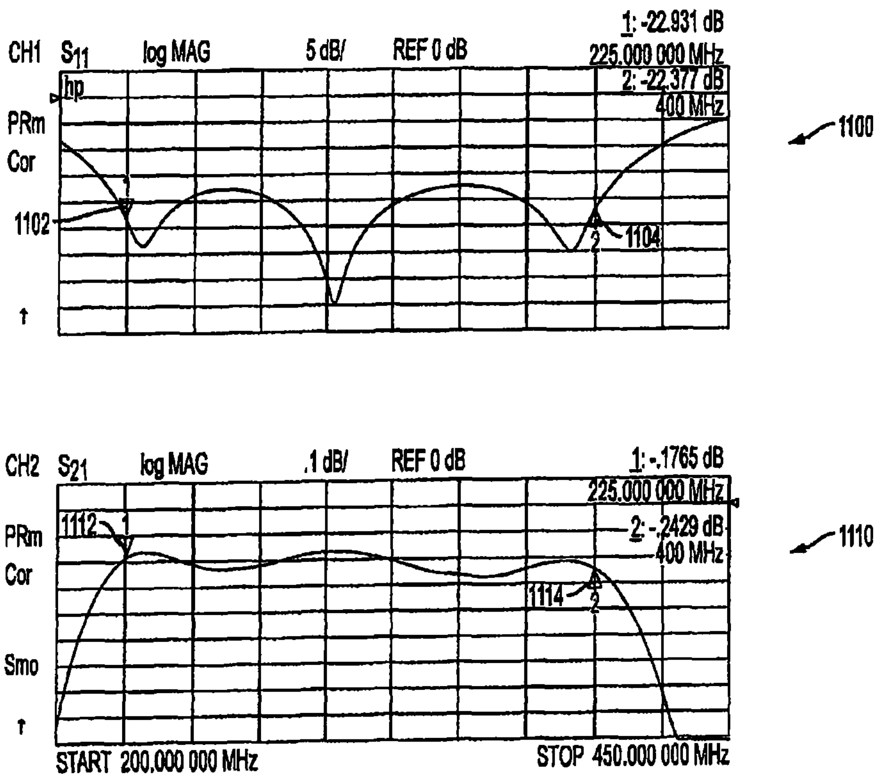
FIG. 11 is a top graph of the input in-band return loss and a bottom graph of the input in-band insertion loss of the RF surge protector of FIG. 10 according to an embodiment of the invention.
Figure 12:
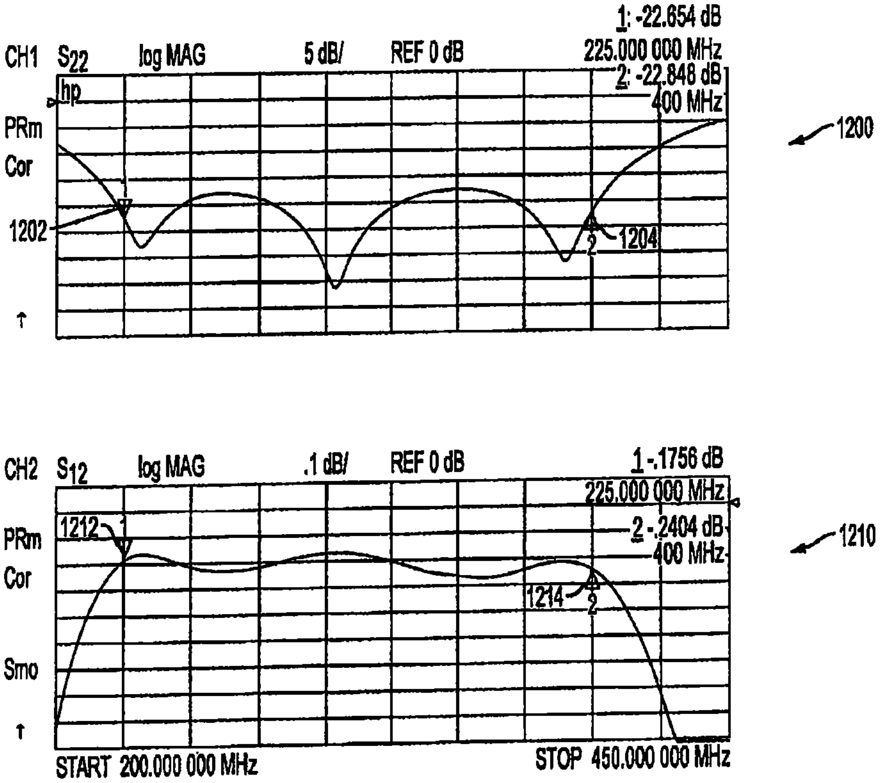
FIG. 12 is a top graph of the output in-band return loss and a bottom graph of the output in-band insertion loss of the RF surge protector of FIG. 10 according to an embodiment of the invention.

Referring now to FIG. 11 and FIG. 12, graphs are displayed showcasing in-band operating characteristics of the input and the output of the circuit shown by schematic circuit diagram 900. Graph 1100 (see FIG. 11) shows the input in-band return loss and graph 1200 (see FIG. 12) shows the output in-band return loss. For signals operating at frequencies within the pass-band of the filter shown by schematic circuit diagram 900, a high return loss (e.g., at least 17 dB) is desirable. The circuit shown by schematic circuit diagram 900 has been configured for an operating frequency range of 225 to 400 MHz as described above for FIG. 9. Input data-point 1102 (see FIG. 11) indicates around 23 dB of return loss at 225 MHz. Input data-point 1104 (see FIG. 11) indicates around 22 dB of return loss at 400 MHz. Similarly, output data-point 1202 (see FIG. 12) indicates around 23 dB of return loss at 225 MHz and output data-point 1204 (see FIG. 12) indicates around 23 dB of return loss at 400 MHz.

For signals operating at frequencies within the pass-band of the filter shown by the circuit shown in schematic circuit diagram 900 (see FIG. 9), a low insertion loss (e.g., less than or equal to 0.4 dB) is also desirable to limit the attenuation of pass-band signals. Graph 1110 (see FIG. 11) shows the input in-band insertion loss and graph 1210 (see FIG. 12) shows the output in-band insertion loss. Input data-point 1112 (see FIG. 11) indicates around 0.18 dB of insertion loss at 225 MHz. Input data-point 1114 (see FIG. 11) indicates around 0.24 dB of insertion loss at 400 MHz. Similarly, output data-point 1212 (see FIG. 12) indicates around 0.18 dB of insertion loss at 225 MHz and output data-point 1214 (see FIG. 12) indicates around 0.24 dB of insertion loss at 400 MHz.

Figure 13:
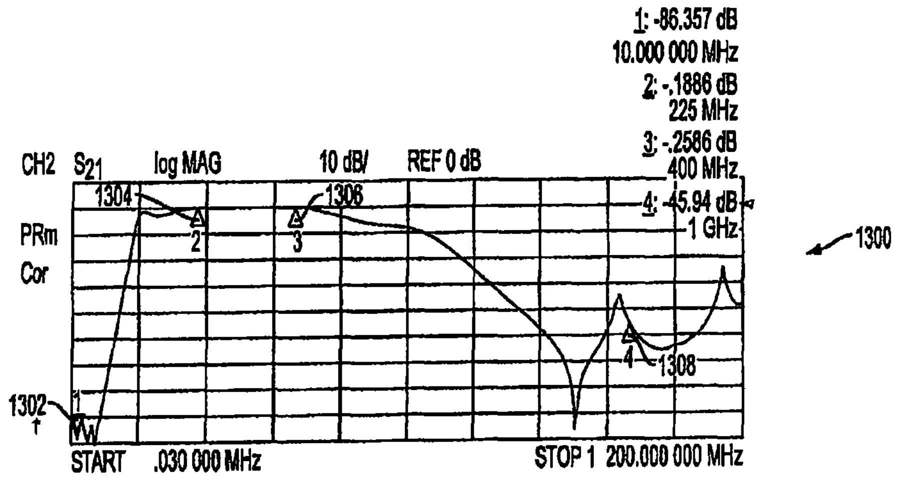
FIG. 13 is a graph of the input out-of-band insertion loss of the RF surge protector of FIG. 10 according to an embodiment of the invention.
Figure 14:
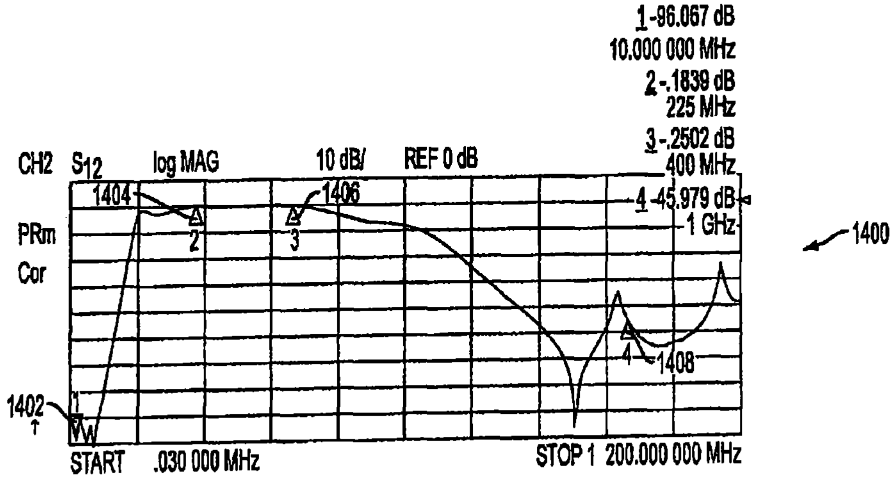
FIG. 14 is a graph of the output out-of-band insertion loss of the RF surge protector of FIG. 10 according to an embodiment of the invention.

FIG. 13 and FIG. 14 display graphs showcasing out-of-band operating characteristics of the input and the output of the circuit shown by schematic circuit diagram 900. Since the circuit shown by schematic circuit diagram 900 has been configured for an operating frequency range of 225 to 400 MHz, data-points at frequencies outside that pass-band are chosen for examples of out-of-band insertion loss. A high insertion loss (e.g., at least 40 dB) is desirable for out-of-band signals since out-of-band signals are to be highly attenuated.

Graph 1300 (see FIG. 13) shows the input out-of-band insertion loss and graph 1400 (see FIG. 14) shows the output out-of-band insertion loss. Input data-point 1302 (see FIG. 13) indicates around 86 dB of insertion loss at 10 MHz. Input data-point 1308 (see FIG. 13) indicates around 46 dB of insertion loss at 1 GHz. Similarly, output data-point 1402 (see FIG. 14) indicates around 96 dB of insertion loss at 10 MHz and output data-point 1408 (see FIG. 14) indicates around 46 dB of insertion loss at 1 GHz. As described above for FIG. 11 and FIG. 12, in-band insertion loss for input and output signals with frequencies of 225 to 400 MHz is low as shown by input data-points 1304 and 1306 (see FIG. 13) and output data-points 1404 and 1406 (see FIG. 14).

The discussion now turns to alternative embodiments of a band pass RF filter for surge suppression. One alternative embodiment may position components of a circuit within an interior cavity of a housing without the use of a printed circuit board and/or by incorporating at least one RF isolating wall as part of the housing for improving RF or other circuit performance. In addition, the circuit may be configured with one or more capacitances to provide for additional tuning of the circuit to achieve desired operational performance. The following embodiments may incorporate any of the structural or functional features described above for FIGS. 1-14 in addition to or in replacement of the structural or functional features described below for FIGS. 15-19.

Figure 15:
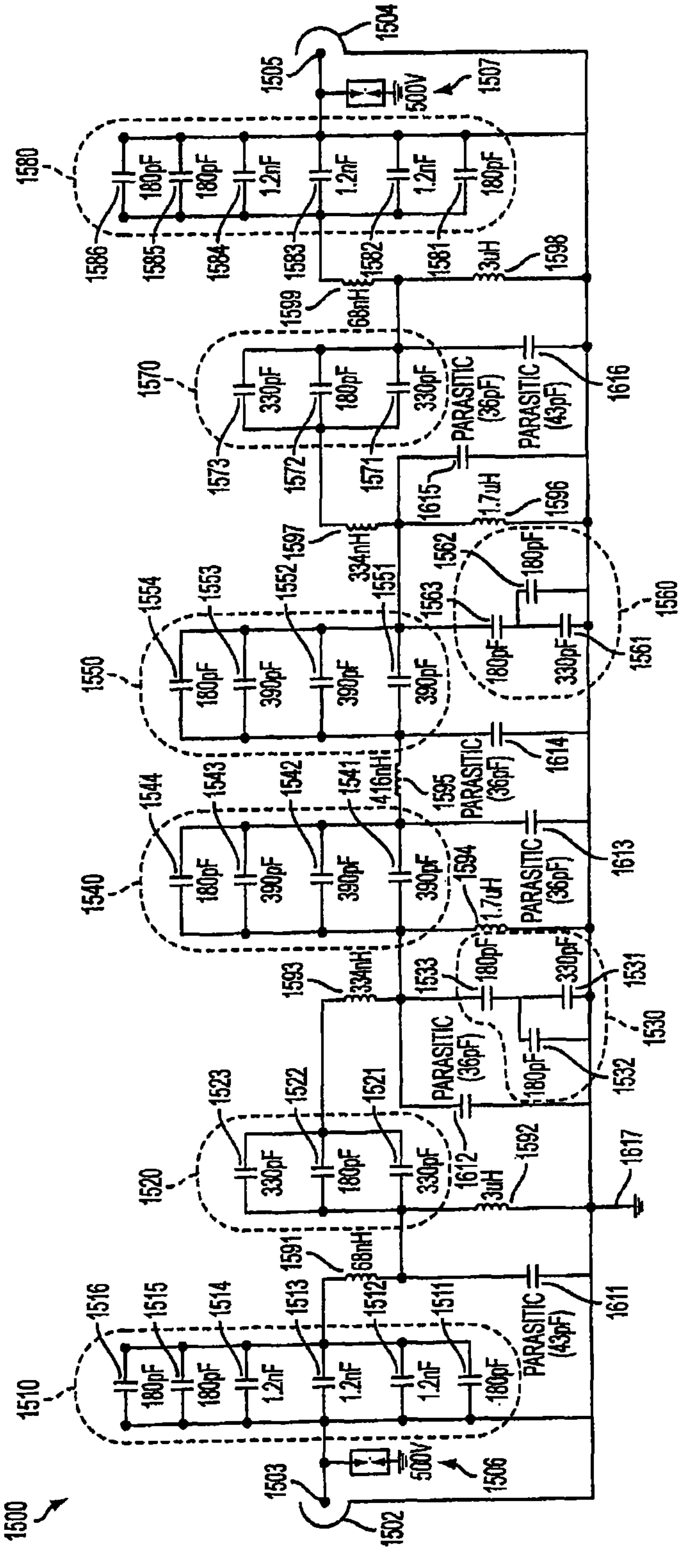
FIG. 15 is a circuit of a high power band pass RF filter according to an embodiment of the invention.

Referring now to FIG. 15, a circuit 1500 is shown for a high power band pass RF filter according to an embodiment of the invention. The circuit 1500 includes a number of circuit components, such as capacitors and inductors, that are attached or mounted within a cavity 1602 of a housing 1601 (see also FIG. 2). The housing 1601 and/or the walls of the housing 1601 that define the cavity 1602 may be conductive such that they operate as a ground for the circuit 1500. Certain circuit components may be fastened or coupled with a Teflon block or strip that serves as a dielectric to prevent shorting of the components to ground, as discussed in greater detail herein. For illustrative purposes, the circuit 1500 is shown in FIG. 1 and will be described with the components having specific capacitance, inductance or voltage values to achieve specific RF band pass frequencies of operation and power requirements. However, other specific capacitance, inductance, or voltage values or configurations may be used to achieve other specific RF band pass frequencies and power requirements. Moreover, other electronic filters (e.g., low pass filters, high pass filters or band stop filters) may also be achieved in place of the band pass filter.

The circuit 1500 operates as a high power band pass filter with an operating frequency range between 3 MHz and 30 MHz. Signals outside of this frequency range or pass-band are attenuated. Frequency performance of the circuit 1500 includes a desirable high return loss of greater than 20 dB within the operating frequency range of 3 to 30 MHz. Likewise, a desirable low insertion loss of less than 0.55 dB is obtained within the operating frequency range of 3 to 30 MHz. By contrast, for signals at frequencies outside the operating range, the insertion loss is greater than 80 dB at or below 281 KHz and is greater than 50 dB at 360 MHz to 1 GHz. Thus, the out-of-band frequencies are highly attenuated while in-band frequencies are not. In addition, the circuit 1500 produces sharp roll-offs of signals, which is desirable for band pass filters. The circuit 1500 can also handle up to 500 Watts of continuous power, making it effective in high power applications or environments.

Similar or the same to the above description for FIG. 1, the circuit 1500 includes an input port 1502 having a center pin 1503, an output port 1504 having a center pin 1505, and various circuit components coupled between the center pin 1503 of the input port 1502 and the center pin 1505 of the output port 1504. Surge suppression components 1506 and 1507 (e.g. gas tubes) connect with the center pin 1503 or 1505, respectively, to help prevent surges from propagating from the input port 1502 through to the output port 1504 or vice versa. The surge suppression components 1506 or 1507 may be contained within the housing 1601 and/or may be included as part of a connector assembly acting as the input port 1502 or output port 1504, as discussed in greater detail for FIG. 16. A non-surge signal applied at the input port 1502 travels through various of the circuit components to the output port 1504. The circuit 1500 may also operate in a bi-directional mode; hence, input port 1502 can be an output port and output port 1504 can be an input port. The connection between the input port 1502 and the output port 1504 may be a center conductor, such as a coaxial line, as described in greater detail above for FIG. 2. The connection between the input port 1502 and the output port 1504 may alternatively be any conductive pathway formed through a variety of the discrete circuit components that would enable signal flow through the circuit 1500 and the center pins 1503 and 1505 maintain the RF impedance. A variety of circuit types or configurations may be achieved by addition, subtraction, or other manipulation of circuit components.

Turning more specifically to the various circuit components used in the circuit 1500, eight sets of capacitors (1510, 1520, 1530, 1540, 1550, 1560, 1570 and 1580) are disposed between the input port 1502 and the output port 1504. Each of the eight sets of capacitors is placed in a series or a parallel circuit configuration relative to one or more of the sets of capacitors. For example, the capacitor set 1510 forms a series connection with the capacitor set 1520. Within each capacitor set, the capacitors are arranged in a parallel circuit configuration. For example, the capacitors 1511, 1512, 1513, 1514, 1515 and 1516 of the capacitor set 1510 are arranged in a parallel circuit configuration with one another.

The eight sets of capacitors (1510, 1520, 1530, 1540, 1550, 1560, 1570 and 1580) are used to increase the power handling capabilities of the circuit 1500 and the capacitor sets 1510 and 1580 are used to attenuate the out-of-band frequencies or signals transmitting through the circuit 1500. As stated above, the circuit 1500 has been configured to handle up to 500 Watts of continuous power. Thus, in one embodiment, the capacitors 1511, 1515, 1516, 1522, 1532, 1533, 1544, 1554, 1562, 1563, 1572, 1581, 1585 and 1586 each have a capacitance value of approximately 180 picoFarads (pF). The capacitors 1512, 1513, 1514, 1582, 1583 and 1584 each have a capacitance value of approximately 1.2 nanoFarads (nF). The capacitors 1521, 1523, 1531, 1561, 1571 and 1573 each have a capacitance value of approximately 330 pF. The capacitors 1541, 1542, 1543, 1551, 1552 and 1553 each have a capacitance value of approximately 390 pF. In an alternative embodiment, any capacitance values may be chosen for any of the above capacitors in order to obtain desired power handling capabilities and/or attenuation characteristics of a circuit.

The circuit 1500 also includes nine inductors (1591, 1592, 1593, 1594, 1595, 1596, 1597, 1598 and 1599) positioned between the input port 1502 and the output port 1504 and are used for in-band tuning of the circuit 1500. In one embodiment, the inductors 1591 and 1599 each have a value of approximately 68 nanoHenries (nH), the inductors 1592 and 1598 each have a value of approximately 3 microHenries (uH), the inductors 1593 and 1597 each have a value of approximately 334 nH, the inductors 1594 and 1596 each have a value of approximately 1.7 uH, and the center inductor 1595 has a value of approximately 416 nH. The described inductor values may substantially change when immersed in a fluid, such as oil, discussed in greater detail herein, as opposed to in air. Similar to the capacitors described above, in an alternative embodiment, any inductance values may be chosen.

One or more capacitances may be used to tune the band-pass stage of the circuit 1500. For example, capacitances (1611, 1612, 1613, 1614, 1615, and 1616) may be used to tune the band-pass stage of the circuit 1500. The capacitances 1611 and 1616 each have a value of approximately 43 pF and the capacitances 1612, 1613, 1614 and 1615 each have a value of approximately 36 pF each. As shown, the capacitances (1611, 1612, 1613, 1614, 1615 and 1616) are grounded to a ground 1617. The ground 1617 may be a housing for containing the circuit 1500 or the ground 1617 may be attached to the housing. The housing may be the housing 1601 (see FIG. 16), as discussed in greater detail herein, which may be the same or similar to the housing 302 described above.

Figure 16:
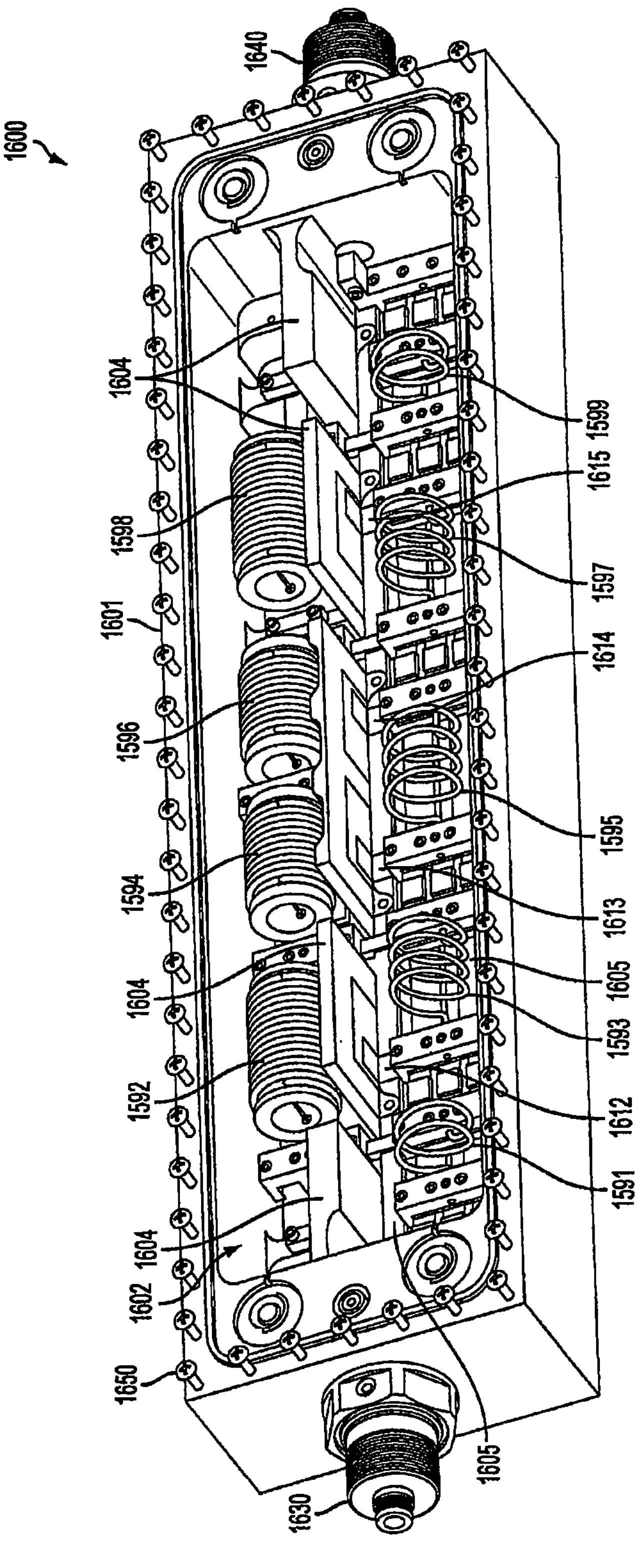
FIG. 16 is a perspective top view of an RF surge protector with the top plate removed for housing the circuit shown in FIG. 15 according to an embodiment of the invention.
Figure 17:
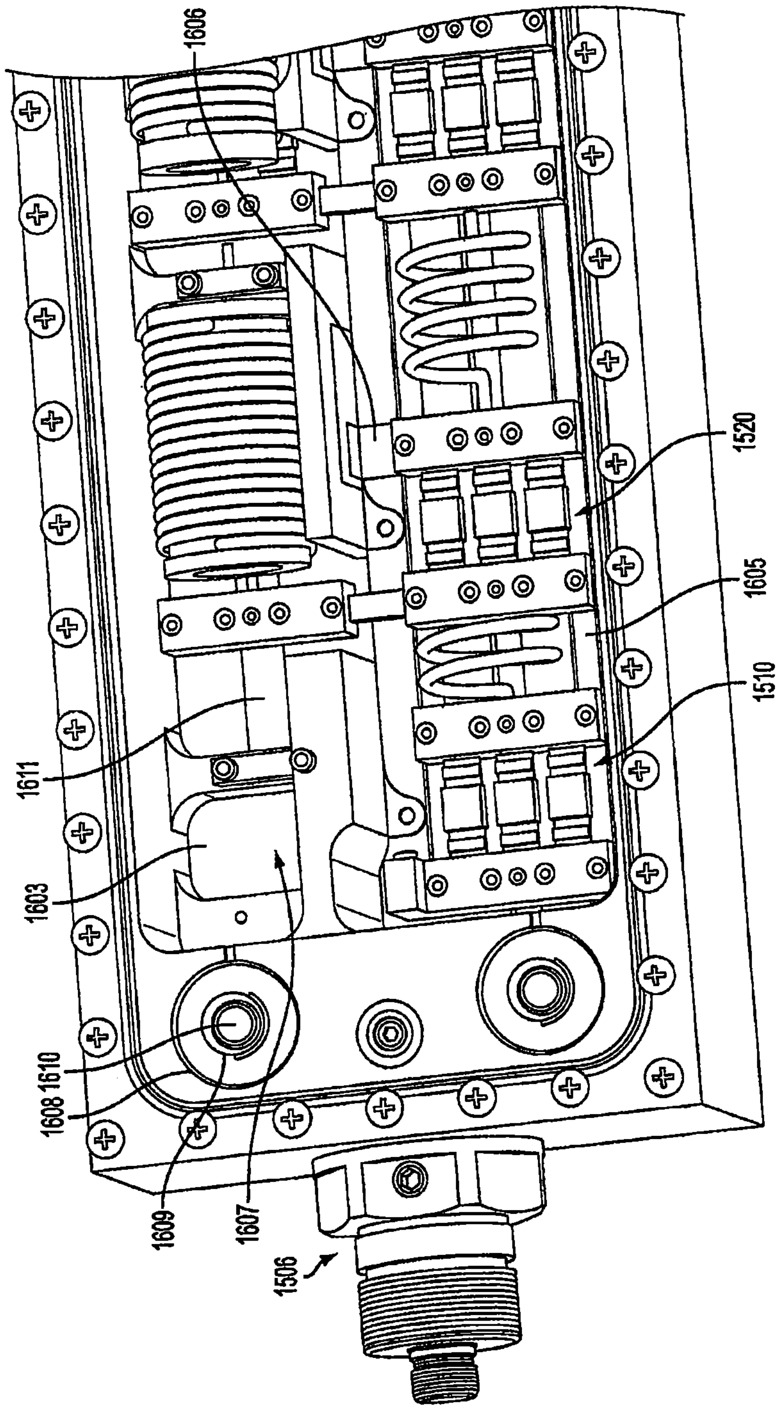
FIG. 17 is a zoomed top view of a portion of the RF surge protector of FIG. 16 according to an embodiment of the invention.

Referring next to FIG. 16, a perspective top view of an RF surge protector 1600 is shown with a top plate removed and for housing the circuit 1500 described above for FIG. 15, according to an embodiment of the invention. Similarly, FIG. 17 shows a zoomed top view of a portion of the RF surge protector 1600 of FIG. 16, according to an embodiment of the invention. The RF surge protector 1600 has a housing 1601 defining an interior cavity 1602. The housing 1601 may be the same or similar to the housing 302 described above and the cavity 1602 may be the same or similar to the cavity 319 described above. The components shown by the circuit 1500 (see FIG. 1) are configured to be positioned within the cavity 1602 of the housing 1601.

For example, an insulative block or strip (e.g. Teflon) may be used as a dielectric and configured to attach or hold any of the components shown by the circuit 1500. The components shown by the circuit 1500 may be mounted upon the insulative block or strip such that they do not short to a ground of the housing 1601 when disposed within the cavity 1602. The circuit components may be discrete elements positioned and fastened within the cavity 1602. In an alternative embodiment, any or all of the circuit components may be included on a printed circuit board for placement in the cavity 1602. The circuit components of the circuit 1500 are fastened with the housing 1601 via a plurality of screws or other mechanical fasteners. In an alternative embodiment, the circuit components may be coupled with the housing 1601 by any type of fastener (e.g. glue or other adhesive) or no fasteners may be needed.

With reference to FIG. 15, the circuit 1500 electrically connects to a first connector assembly 1630 that is secured to a portion of the housing 1601. The first connector assembly 1630 functions as the input port 1502 shown on the circuit 1500 and as a first connection terminal of the RF surge protector 1600. Similarly, a second connector assembly 1640 secured to a portion of the housing 1601 is electrically connected to the circuit 1500 and functions as the output port 1504 shown on circuit 1500 and as a second connection terminal of the RF surge protector 1600. The first connector assembly 1630 and/or the second connector assembly 1640 may have the same or similar structural or functional features as described for the connector assembly 301, discussed above, for example in FIGS. 3 and 4.

For example, surge suppression components 1506 or 1507 may be incorporated into or configured to be received by the first connector assembly 1630 and/or the second connector assembly 1640. The same or similar to the description above for FIGS. 3 and 4, the surge suppression components 1506 or 1507 (see FIG. 15) may be positioned within a non-conductive tube (e.g. a plastic or PTFE tube) for placement within a connector cavity of the first connector assembly 1630 or second connector assembly 1640. Such a configuration isolates the surge suppression components 1506 or 1507 from an exterior housing of the connector assemblies for preventing shorting to ground. The surge suppression components 1506 or 1507 are integrated into their respective connector assemblies and thus do not come into contact with any oil 1607 (see FIG. 17) that may be contained within the housing 1601. In one embodiment, the surge suppression components 1506 or 1507 are gas tubes and have a breakdown voltage of approximately 500 volts and may be determined from transmit power requirements.

One or more walls 1604 may be attached to or manufactured as part of the housing 1601 such that they extend within the cavity 1602 of the housing 1601 in a direction that is perpendicular to a plane defined by a bottom surface 1603 (see FIG. 17) of the housing 1601. The walls 1604 are positioned in the cavity 1602 of the housing 1601 so as to partially or fully segregate or divide the interior cavity 1601 into two or more smaller sections, thus allowing circuit components of the circuit 1500 to be placed in the various sections to aid in RF isolation. In one embodiment, each of the walls 1604 may be connected with the bottom surface 1603, such that they form a stable unit with the housing 1601. The components of the circuit 1500 may be positioned adjacent to either one side or the other side of the walls 1604, thus allowing the walls 1604 to help isolate RF signals propagating through or within the housing 1601.

For example, the walls 1604 may be positioned longitudinally in a row and/or side-by-side with one another, forming gaps there between. The walls 1604 may extend between two ends of the housing 1601 so as to substantially divide the interior cavity 1602 of the housing 1601 into two or more smaller sections or areas with a plurality of passages there between located at each of the gaps between the walls 1604 to allow for signal pathways or propagation from circuit components on one side of the walls 1604 to circuit components on the other side of the walls 1604. Alternatively, signal paths may be formed through vias or other holes through the walls 1604 in addition to or in replacement of pathways at gaps between the walls 1604. The walls 1604 may be positioned or configured so as to provide as few or as many divided sections of the interior cavity 1602 as desired. In one embodiment, only one wall 1604 may be used and may or may not form a gap with one or more sides of the housing 1601 defining the interior cavity 1602. The walls 1604 may be conductive and thus act as a ground location for the circuit 1500. In one embodiment, the walls 1604 may be about 0.5 inches high and made of a copper material.

Various of the capacitors, inductors or other components of the circuit 1500 described above for FIG. 15 may be placed or positioned longitudinally in a row on one side or the other of the walls 1604 in order to obtain any desired RF isolation. For example, the inductors (1592, 1594, 1596, 1598) may be lined up in one section (e.g., a shunt section) of the interior cavity 1602 and on one side of the walls 1604, while inductors (1591, 1593, 1595, 1597, 1599) may be lined up in a second section (e.g. a serial section) of the interior cavity 1602 and on the other side of the walls 1604, thus isolating the components from one another for RF interference purposes. Alternative component configurations are envisioned, either for the inductors, capacitors, or any other components of the circuit 1500 so as to optimally achieve any desired RF performance of the circuit.

As shown in FIG. 17, an insulating material 1605 (e.g., a Teflon block, strip, tape, or other material) may be placed along or on the bottom surface 1603 of the housing 1601 to isolate the components placed thereon from the ground 1617. The insulating material 1605 may be located only on one side of the walls 1604 (e.g. the serial section), thus maintaining separation between certain circuit components in the serial section and the ground of the housing 1601. Alternatively, the insulating material 1605 may be located in any section or any portion of any section in the cavity 1602 of the housing 1601 for desired isolation of circuit components in such areas from ground. In one embodiment, the insulating material may have a thickness of about ¼ inch.

The capacitances (1611, 1612, 1613, 1614, 1615 and 1616) discussed above for the circuit 1500 may be desired for providing additional tuning of the operational performance of the circuit 1500. These capacitances may be formed using the bottom surface 1603 of the housing 1601 as one capacitor plate, a conductive or copper tab or element 1606 (see FIG. 17) as the other capacitor plate, and an insulating element 1902 (see FIG. 19) as the dielectric between the two capacitor plates. In one embodiment, the insulating element 1902 may be a Kapton tape adhered or otherwise connected between the conductive or copper tab 1606 and a ground 1607 of the RF surge protector 1600. If the housing 1601 acts as the ground 1607 and if one of the walls 1604 is conductive with that ground 1607, the insulating element 1902 may be positioned between the conductive or copper tab 1606 and the one of the walls 1604. Alternatively, the insulating element 1902 may be positioned at any location in the cavity 1602 of the housing 1601 such that the conductive or copper tab 1606 cooperates with the insulating element 1902 to form a capacitance, such as along a side of the housing 1601 that forms the cavity 1602. Thus, a variety of capacitances can be obtained by varying the geometry or materials of any or all of the housing 1601, the conductive or copper tab 1606 or the insulating element 1902. In an alternative embodiment, the insulating material 1605 described above may serve as the insulating element 1902 for the formation of one or more capacitances. For example, the thickness of the insulating material 1605 may vary along a length of the insulating material 1605, thus allowing for varying capacitance values along the length of the insulating material 1605 when interfacing with the conductive or copper tab 1606.

As described above for FIG. 3, the interior cavity 1602 defined by the housing 1601 may be filled with oil 1607 for dissipating heat caused by the heating of the components (e.g., capacitors and inductors) of the circuit 1500. The oil 1607 may be the same or similar to the oil 315 described above for FIG. 3 and may fill the cavity 1602 completely or partially, for example filling a volume of approximately 90 cubic inches. The cavity 1602 or the housing 1601 is completely fluid-sealed in order to contain the oil 1607 within the cavity 1602 or the housing 1601 without leaking.

One or more cylindrical cavities 1608 are also included in the housing 1601 for the placement of piston springs 1609 and pistons 1610 for allowing the oil 1607 to expand. Similar or the same to the discussion above for FIG. 3, the piston springs 1609 and/or pistons 1610 are used to exert constant pressure within the interior cavity 1602 when a top plate 1620 (see FIG. 18) is attached to the housing 1601. The piston springs 1609 and the pistons 1610 are sealed from the oil 1607 using the O-rings. Alternatively, the one or more cylindrical cavities 1608 can be used as overflow cavities for any excess oil from the interior cavity 1602 due to heating and expanding of the oil 1607. Other air reservoirs in addition to, or in replacement of, the cylindrical cavities 1608 may be incorporated into the housing 1601 for allowing for thermal expansion of the oil 1607.

Figure 18:
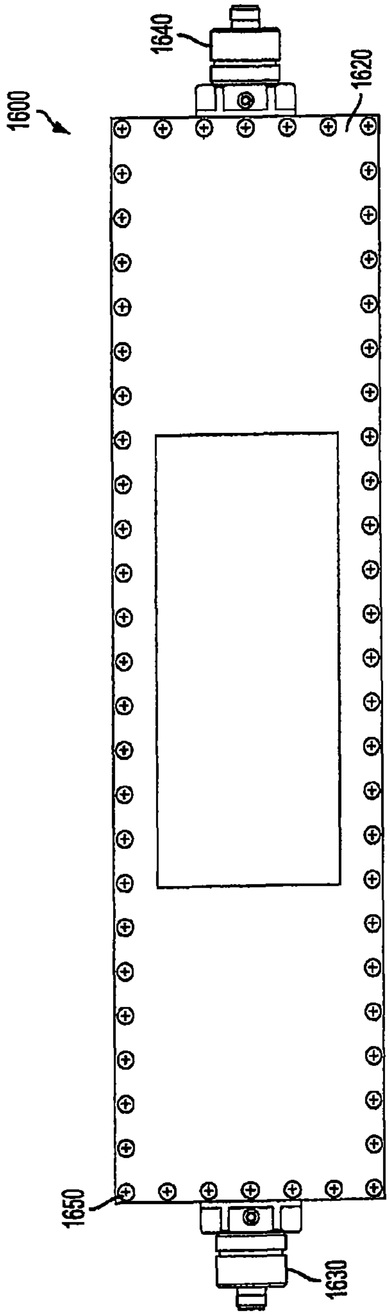
FIG. 18 is a top view of the RF surge protector of FIG. 16 with the top plate included according to an embodiment of the invention.

FIG. 18 shows a top view of the RF surge protector 1600 with the top plate 1620 fastened according to an embodiment of the invention. Thus, a user of the RF surge protector 1600 may simply interface with the first connector assembly 1630 and/or the second connector assembly 1640 when connecting the RF surge protector 1600 to their equipment as the oil 1607 and other circuit components of the circuit 1500 are securely contained within the housing 1601 of the RF surge protector 1602. The top plate 1620 is sealed to the housing 1601 using an O-ring and a plurality of cover screws 1650 in order to establish a leak-free connection with the housing 1601. The RF surge protector 1600 may include a closed cell foam material (not shown) attached to an inner surface of the housing 1601 or the top plate 1620 for disrupting the dielectric constant of the oil 1607 and for keeping high frequency out-of-band signals from reflecting within the cavity 1602 causing signal interferences. The foam material may be constructed, sized and/or positioned the same or similar to the foam material 316 described above for FIG. 3.

Figure 19:
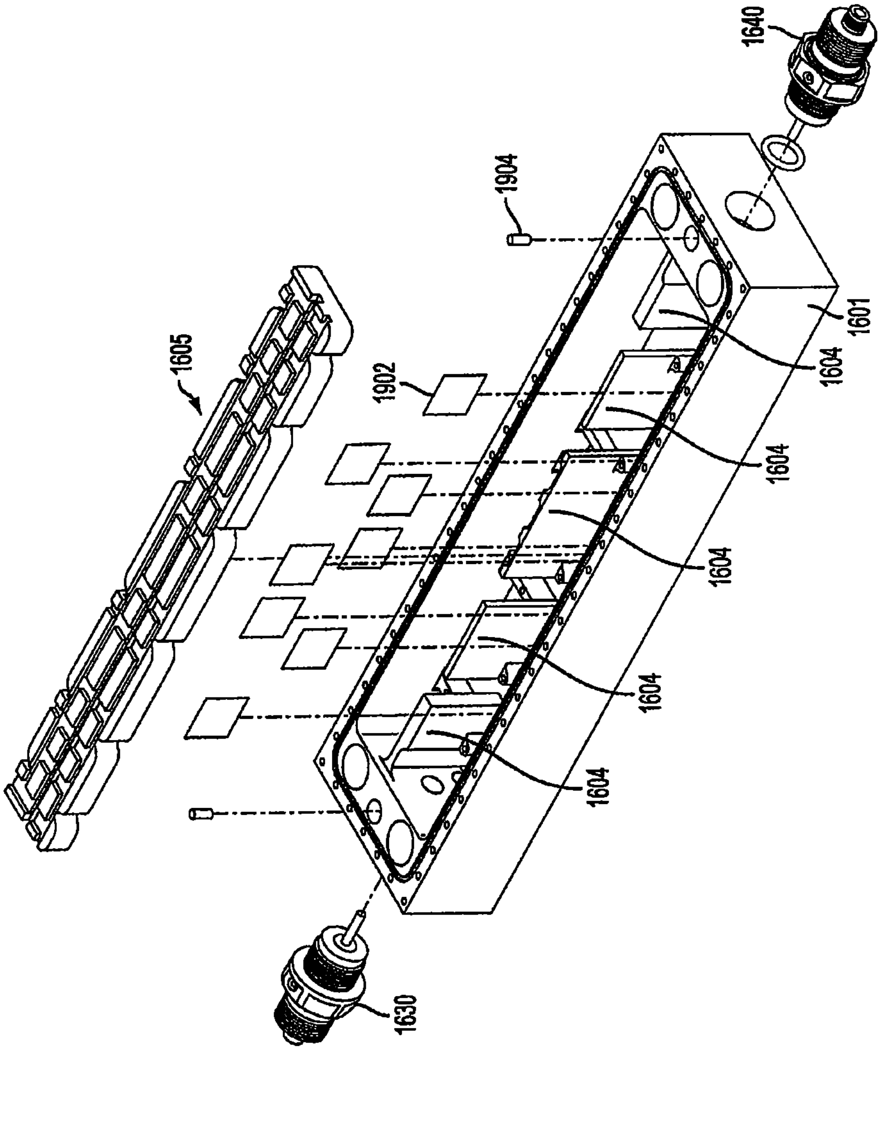
FIG. 19 is an exploded perspective view of the RF surge protector of FIG. 16 with the top plate removed according to an embodiment of the invention.

Referring next to FIG. 19 and with reference to FIGS. 15-17, an exploded perspective view of the RF surge protector 1600 is shown with the top plate removed according to an embodiment of the invention. The insulating material 1605 is shown for coupling with various components of the circuit 1500 and for placement within the interior cavity 1602 of the housing 1601. When placed within the housing 1601, certain components or nodes of the circuit 1500 connect with either the first connector assembly 1630 or the second connector assembly 1640. The first connector assembly 1630 and the second connector assembly 1640 are secured with the housing 1601 by set screws 1904.

Within the housing 1601, the walls 1604 are shown substantially dividing the interior cavity of the housing 1601 into two smaller sections (e.g. a serial section and a shunt section). Thus, certain components of the circuit 1500 are disposed in one section of the interior cavity 1602 while other components of the circuit 1500 are disposed the other section of the interior cavity. The insulating material 1605 may couple with components for placement in one of the two sections (e.g. the serial section). The components may be attached to the insulating material 1605 prior to placement within the cavity 1602. RF interference among the components may thus be controlled by appropriate placement of the walls 1604 and/or the layout of the components. In an alternative embodiment, any number of the walls 1604 may be utilized to divide the interior cavity of the housing 1601 into any number of smaller sections.

Insulating elements 1902 (e.g. Kapton tape) may be placed within the cavity 1602 of the housing 1601 for the creation of capacitances, as described above for FIG. 16-17. The insulating elements 1902 may be located along the sides of the housing 1601 defining the cavity 1602 and/or on the walls 1604. In an alternative embodiment, the insulating elements 1902 may be disposed in any location or configuration such that they are positioned between two conductive plates or elements of or in the cavity 1602 so as to form a capacitance value.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An electronic filtering device comprising:

a fluid-sealed housing defining a cavity therein;

a first wall coupled with the housing and positioned in the cavity, the first wall having a first side and a second side;

a first circuit component positioned in the cavity and adjacent to the first side of the first wall;

a second circuit component positioned in the cavity and adjacent to the second side of the first wall;

a fluid disposed in the cavity, the fluid contacting the first circuit component or the second circuit component for cooling the first circuit component or the second circuit component;

a connector assembly coupled with the housing, the connector assembly having a conductive element electrically connected to the first circuit component or the second circuit component; and a surge protection element electrically connected between the conductive element and the housing.

2. The electronic filtering device of claim 1 wherein the connector assembly comprises a coaxial line having a center pin as the conductive element that propagates dc currents and RF signals and an outer shield that surrounds the center pin.

3. The electronic filtering device of claim 1 wherein the connector assembly further comprises a connector housing and wherein a portion of the surge protection element is positioned in the connector housing.

4. The electronic filtering device of claim 1 wherein the surge protection element is a gas tube.

5. The electronic filtering device of claim 1 wherein the fluid is a silicon transformer oil or a mineral oil.

6. The electronic filtering device of claim 1 further comprising a second wall coupled with the housing and positioned in the cavity, the first wall and the second wall positioned along a common axis.

7. The electronic filtering device of claim 6 wherein the first wall is separated from the second wall along the common axis.

8. A high power band pass RF filtering apparatus for the filtering of electronic signals, the apparatus comprising:

a sealed housing defining a cavity therein and configured to prevent a leaking of fluid to outside of the housing, the cavity at least partially defined by a conductive surface of the housing;

a circuit component located in the cavity and coupled with the housing;

a conductive element located in the cavity of the housing;

an insulating element located between the conductive surface of the housing and the conductive element in the cavity for generating a capacitance;

an oil disposed in the cavity and contacting the circuit component for dissipating heat from the circuit component;

a connector assembly having a center pin electrically connected to the circuit component, the connector assembly secured to the housing and configured to provide an electrical connection from outside the housing to the circuit component in the cavity of the housing; and a surge protection element integrated with the connector assembly, the surge protection element electrically connected between the center pin of the connector assembly and the housing.

9. The high power band pass RF filtering apparatus of claim 8 wherein the oil is configured to dissipate heat from the circuit component from around 120° C. to around 80° C.

10. The high power band pass RF filtering apparatus of claim 8 wherein the oil substantially fills the cavity of the housing.

11. The high power band pass RF filtering apparatus of claim 8 wherein the conductive element is a copper tab.

12. The high power band pass RF filtering apparatus of claim 11 wherein the insulating element is a Kapton tape.

13. The high power band pass RF filtering apparatus of claim 8 further comprising a second cavity defined by the housing, the second cavity in fluid communication with the cavity of the housing for allowing the oil to overflow from the cavity to the second cavity.

14. The high power band pass RF filtering apparatus of claim 13 further comprising a piston located in the second cavity for exerting pressure on the oil if the oil overflows to the second cavity.

15. The high power band pass RF filtering apparatus of claim 8 wherein the surge protection element is a dual-chambered gas tube.

16. A high power band pass RF filtering apparatus with surge protection for the attenuation of frequencies outside of a pass-band, the high power band pass RF filtering apparatus comprising:

a housing defining a cavity therein, the housing adapted to prevent a leaking of fluid from within the cavity to outside of the housing;

a first wall coupled with the housing and positioned within the cavity, the first wall disposed along a first axis;

a second wall coupled with the housing and positioned within the cavity, the second wall disposed along the first axis;

an insulating material positioned within the cavity and adjacent to the first wall or the second wall;

a first circuit component positioned within the cavity and coupled to the insulating material;

a second circuit component positioned within the cavity and coupled to the housing;

an oil disposed within the cavity and substantially filling the cavity, the oil submerging the first circuit component or the second circuit component for dissipating heat;

an input connector assembly secured to the housing and having an input center pin, a portion of the input center pin positioned within the cavity of the housing;

an output connector assembly secured to the housing and having an output center pin, a portion of the output center pin positioned within the cavity of the housing;

an input gas tube integrated with the input connector assembly for surge protection, the input gas tube electrically connected between the input center pin and the housing; and an output gas tube integrated with the output connector assembly for surge protection, the output gas tube electrically connected between the output center pin and the housing.

17. The high power band pass RF filtering apparatus of claim 16 wherein:

a portion of the input connector assembly is positioned outside of the housing; and a portion of the output connector assembly is positioned outside of the housing.

18. The high power band pass RF filtering apparatus of claim 16 wherein the pass-band of the filtering apparatus is about 3 to 30 MHz.

19. The high power band pass RF filtering apparatus of claim 16 wherein the insulating material is Teflon.

20. The high power band pass RF filtering apparatus of claim 16 wherein the oil is completely contained within the housing.

* * * * *